(12) United States Patent
Iwasaki et al.

(10) Patent No.: US 7,018,783 B2
(45) Date of Patent: Mar. 28, 2006

(54) FINE STRUCTURE AND DEVICES EMPLOYING IT

(75) Inventors: Yuichi Iwasaki, Utsunomiya (JP); Ichiro Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 633 days.

(21) Appl. No.: 10/227,794

(22) Filed: Aug. 27, 2002

(65) Prior Publication Data
US 2003/0008245 A1    Jan. 9, 2003

Related U.S. Application Data

(62) Division of application No. 09/150,837, filed on Sep. 10, 1998, now Pat. No. 6,475,704.

(30) Foreign Application Priority Data

Sep. 12, 1997  (JP)  ................................. 9/268087

(51) Int. Cl.
*G03C 5/00*  (2006.01)

(52) U.S. Cl. .................. 430/321; 355/18; 430/322; 430/323; 430/324; 430/394; 430/316

(58) Field of Classification Search ................ 430/321, 430/322, 323, 324, 316, 394; 355/18
See application file for complete search history.

(56) References Cited

U.S. PATENT DOCUMENTS

| 4,985,374 A | 1/1991 | Tsuji et al. ................ 437/229 |
| 5,218,471 A | 6/1993 | Swanson et al. ............ 430/323 |
| 5,324,600 A | 6/1994 | Jinbo et al. .................... 430/5 |
| 5,487,962 A | 1/1996 | Rolfson ......................... 430/5 |
| 5,672,450 A | 9/1997 | Rolfson ......................... 430/5 |
| 5,837,405 A | 11/1998 | Tomofuji et al. ........... 430/321 |
| 5,995,285 A | 11/1999 | Unno .......................... 359/565 |
| 6,051,344 A | 4/2000 | Langston et al. ............... 430/5 |

FOREIGN PATENT DOCUMENTS

| JP | 61-44628 | 3/1986 |
| JP | 61-137101 | 6/1986 |
| JP | 62-42102 | 2/1987 |
| JP | 6-160610 | 6/1994 |
| JP | 7-72319 | 3/1995 |
| JP | 8-15510 | 1/1996 |

OTHER PUBLICATIONS

F.W. Youlton, "Composite Blocking and Pattern Defining Mask," 14(5) *IBM Technical Disclosure Bulletin* 1480 (1971).

*Primary Examiner*—Stanley S Silverman
*Assistant Examiner*—Jonas N. Strickland
(74) *Attorney, Agent, or Firm*—Fitzpatrick, Cella, Harper & Scinto

(57) ABSTRACT

In order to form three or more steps on a substrate with high precision, a first mask is formed to an area on the substrate corresponding with every other step, and also etching is performed on the area of the substrate to which the first mask is not formed, a second mask is formed to an area on the substrate to which the first mask has not been formed, and also etching is performed on the area on the substrate to which the first and the second masks are not formed.

34 Claims, 23 Drawing Sheets

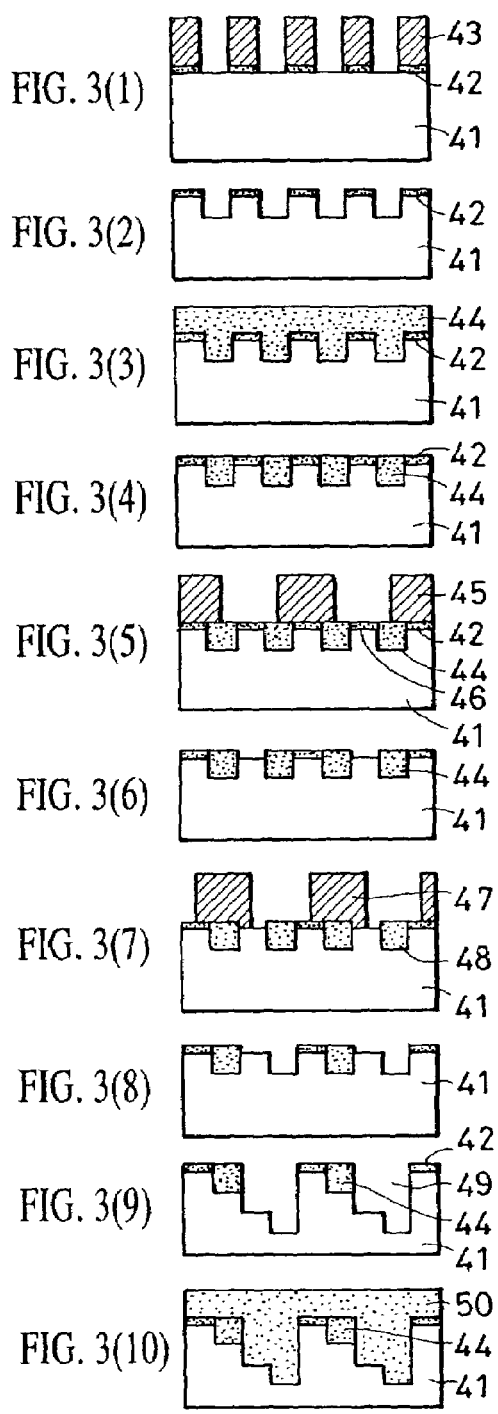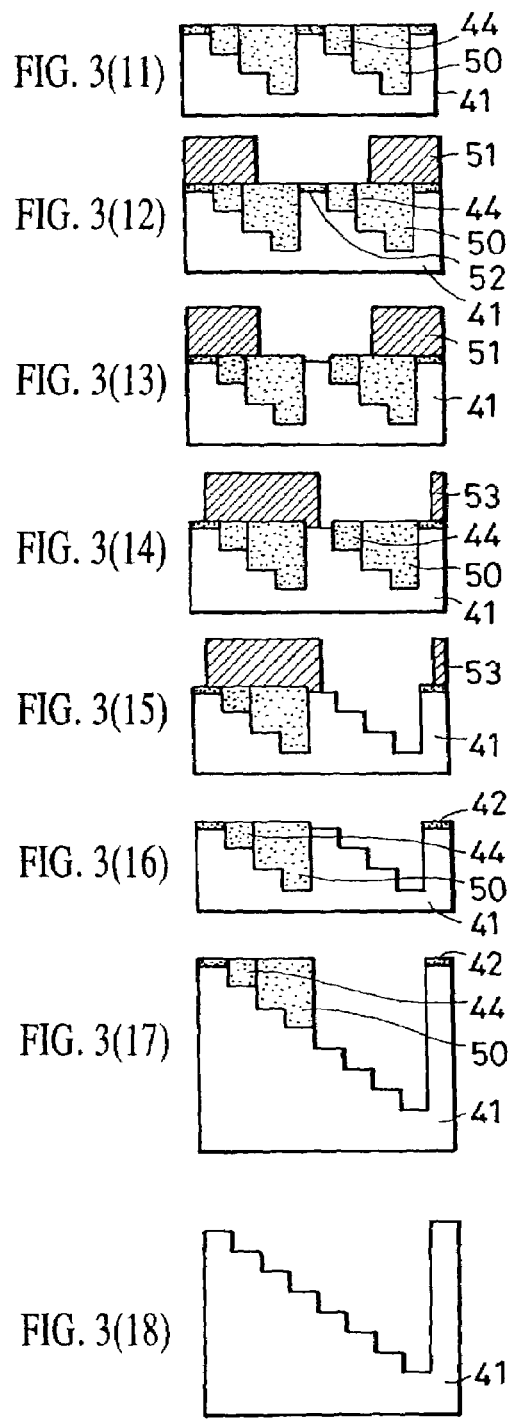

FIG. 6
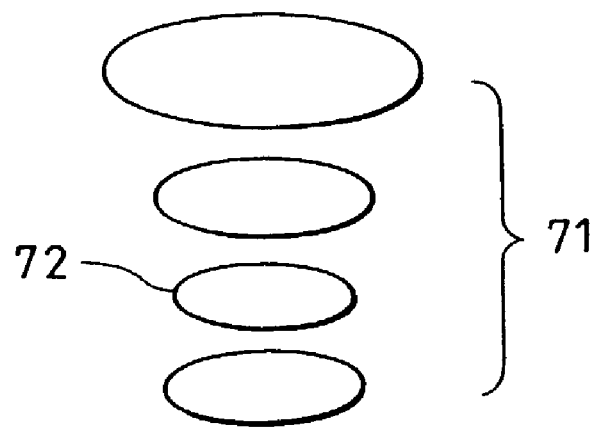
FIG. 7
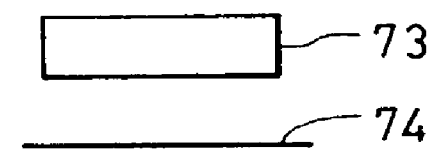
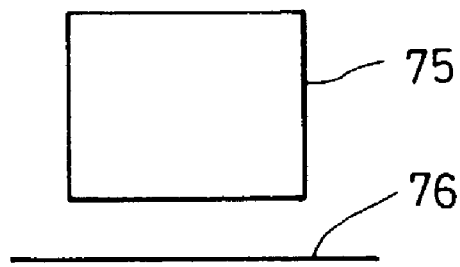

FIG. 15(25)

FINE STRUCTURE AND DEVICES EMPLOYING IT

This application is a divisional of application Ser. No. 09/150,837, filed Sep. 10, 1998 now U.S. Pat. No. 6,475,704.

BACKGROUND OF THE INVENTION

1. Field of the Invention

The present invention relates to a method for manufacturing fine structures such as diffraction grating and the like.

2. Description of Related Art

Known binary optics manufacturing methods wherein a resist is formed into a step-like formation by means of electron beam exposure and developing, and using the structure as a diffraction pattern (diffraction grating), is disclosed in the Electronic Communications Journal (c) J66-CP85-91 January 1983, Japanese Patent Laid-Open No. 62-256601, Japanese Patent Laid-Open No. 62-42102, and so forth.

Also, Japanese Patent Laid-Open No. 61-137101 discloses art wherein two or more types of films with etching endurance are layered to a certain thickness, and sequentially etched from the upper layer so as to form a stair-like formation, which is made to serve as a mold for diffraction optical devices. Also, Japanese Patent Laid-Open No. 61-44628 and Japanese Patent Laid-Open No. 6-160610 disclose art wherein resist is formed on a substrate one step at a time as an etching mask to form a stair-like formation, which is made to serve as a mold for diffraction optical devices.

Further, Japanese Patent Laid-Open No. 8-15510 discloses art wherein one each of a etching stopper layer and a transparent layer are layered on a substrate, so as to directly form a stair-like formation, by means of alignment, exposure, and etching, which is made to serve as a diffraction optical device.

Also, Japanese Patent Application No. 6-26339 and U.S. Pat. No. 5,324,600 disclose art wherein alignment is performed each time the resist is patterned, thus forming a stair-like structure of resist directly in the substrate as an etching mask, which is made to serve as a diffraction optical device. Japanese Patent Laid-Open No. 7-72319, which corresponds to Application No. 6-26339, discloses art for forming a stair-like structure by performing alignment with the resist as an etching mask.

FIG. 26 is a cross-sectional diagram illustrating the manufacturing process of a diffraction optical device of an 8-stepped structure. In Step (1) of FIG. 26, resist is dropped onto a cleansed substrate 1, and the resist is formed into a thin film of 1 µm in thickness by means of spin-coating, which is then baked to form the resist film 2. In Step (2) of FIG. 26, the substrate 1 is mounted to an exposure device capable of exposing the finest diffraction grating pattern into the resist film 2, and exposure light L with sensitivity to the resist film 2 is cast thereupon with a reticle 3 formed with a pattern according to the desired diffraction grating pattern serving as a mask, thereby performing exposure. In the event that a positive-type resist is used, the area exposed by the exposure light L becomes soluble to the developing agent, and so a resist pattern 4 with the certain dimensions is formed, as shown in Step (3) of FIG. 26. In Step (4) of FIG. 26, the substrate 1 is mounted to a responsive ion etching device or an ion beam etching device capable of anisotropic etching, and the etching is performed to the substrate 1 for a certain time to a certain depth, with the patterned resist 4 as the etching mask. Then, removing the resist pattern (4) yields the substrate 1 formed with a pattern 5 having a two-stepped stair-like pattern, as shown in Step (5) of FIG. 26.

Again, in Step (6) of FIG. 26, a resist film 6 is formed on the substrate 1 as with Step (1) and mounted on the exposing device, and following alignment with alignment precision that the exposing device has to the pattern so far formed, with the reticle 7 having a two-fold cycle pattern of the diffraction pattern, following which the resist film 6 is exposed and developed to form an alignment pattern 8 in Step (7) of FIG. 26. Next, removing the resist pattern following dry etching as with Step (4) yields a four-stepped stair-like pattern 9, as shown in Step (8) of FIG. 26.

Further, in Step (9) of FIG. 26, a resist film 10 is formed on the substrate 1 as with Step (1), and with the reticle 11 having a four-fold cycle pattern of the diffraction pattern serving as the mask, a resist pattern 12 is formed in Step (10) of FIG. 26, in the same manner as with Step (7). Next, removing the resist pattern 12 following dry etching yields a diffraction optical device with an eight-stepped stair-like pattern 13, as shown in Step (11) of FIG. 26.

Thus, diffraction optical devices or molds having a stair-like cross-sectional diagram, referred to as "binary optics", can be manufactured by exposure, lithography process based on etching technique, and film-forming technique, these being used in semiconductor manufacturing art. The optical capabilities of such diffraction optical devices are exhibited based on the recessed and projected stair-like form which is formed on the substrate, so the diffraction efficiency thereof is affected by the form, i.e., the depth, width, and cross-sectional form of the formed steps.

In the case of sequentially using such double-fold masks to form a diffraction optical device with a plurality of steps, an ideal 8-step formation A can be manufactured using three masks 17a through 17c, as shown in FIG. 27, so long as there are nonalignment errors or dimensional errors.

However, with the above example, in manufacturing technique using a plurality of masks, margin of error in the form of the steps owing to margin of error in alignment markedly deteriorates diffraction efficiency, and once such an error in form is created it cannot be restored, which consequently raises costs. In reality, it is impossible to completely do away with all such alignment margin of error and dimensional margin of error, so in the event that there is offset in the alignment of the masks 17a through 17c shown in FIG. 28 to the degree of r1 and r2, a diffraction optical device is formed in the form of B instead of the intended form A. Accordingly, the optical capabilities such as diffraction efficiency greatly deteriorate, and in addition, in the event that dimensional errors occur in each layer, the deterioration of optical capabilities decreases even further.

For example, in the event that quartz is used as the substrate and an ideal 8-stepped form as shown by form A is formed with a minimum line width of 0.35 µm, step height d of each of 61 nm, and usage wavelength of 248 nm, the logical diffraction efficiency obtained by subtracting loss from reflection is 95%. On the other hand, in the event that the margin of error r1 between reticle 17a and reticle 17b is 80 nm, for example, and the margin of error r2 between reticule 17a and reticule 17c is 30 nm, the diffraction efficiency drops by 15% to 80% even without taking reflection into consideration, and these results have been confirmed in actual measurement and simulation.

Also, in order to form a multi-stepped diffraction optical device with a similar method, resist processing following a plurality of times of exposing and developing is carried out, and a 16-stepped stair-like diffraction optical device can be manufactured using quartz as the substrate, with, e.g., a minimum line width of 0.35 µm, step height d of each of 30.5 nm, and usage wavelength of 248 nm. In the case of an ideal 16-stepped form, the logical diffraction efficiency obtained by subtracting loss from reflection is 99%, but in the event that margin of error of alignment is included in this, the diffraction efficiency drops far below that of the 8-stepped form.

Thus, control of the dimensions and alignment of resist pattern is in actual practice is quite difficult, reproducibility cannot be obtained, and consequently, the steps become narrower or wider than intended, so that grooves and protrusions non-existent in the ideal step formation are formed, and is problematic in that the optical capabilities of the diffraction optical device markedly deteriorate.

Also, while electron beam drawing does away with a margin of error in alignment, the immense amount of drawing creates a problem of inefficient manufacturing through-put.

Further, generally, in the case of using glass for the diffraction optical device, there is the need to form the resist thickly in order to obtain diffraction patterns with deep steps, since the etching speed is slow and the speed of etching the resist and the glass is approximately the same, and consequently, substances generated by reaction in etching at the deep portions of the grove cannot find a way out in the event that the resist is thick, having an ill effect on the cross-sectional form and disrupting the rectangular form of the side walls.

SUMMARY OF THE INVENTION

It is an object of the present invention to provide a forming method whereby fine steps can be formed at high precision.

The present invention is a method for forming three or more steps on a substrate, the method comprising the steps of: forming a first mask to an area A1 on the substrate corresponding with every one other step, and also performing etching and/or deposition to the area A2 on the substrate to which the first mask is not formed; and forming a second mask to an area on the substrate to which the first mask has not been formed, and also performing etching and/or deposition to the area on the substrate to which the first and the second masks are not formed.

BRIEF DESCRIPTION OF THE DRAWINGS

FIG. 3 is a cross-sectional diagram of a manufacturing process according to a third embodiment;

FIG. 6 is a configuration diagram of a projecting optical system;

FIG. 7 is a configuration diagram of a projecting exposing device;

DESCRIPTION OF THE PREFERRED EMBODIMENTS

The present invention will be described in detail from the embodiments shown in the FIGS. 1 through 25.

Figure 1:
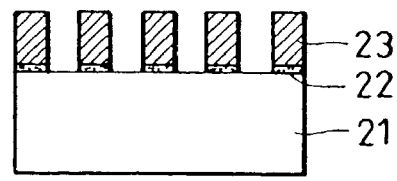
FIG. 1 is a cross-sectional diagram of a manufacturing process according to a first embodiment.
Figure 1:
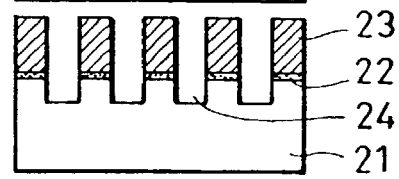
Figure 1:
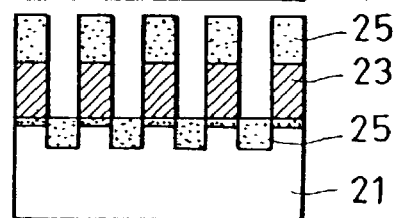
Figure 1:
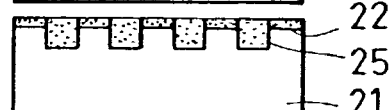
Figure 1:
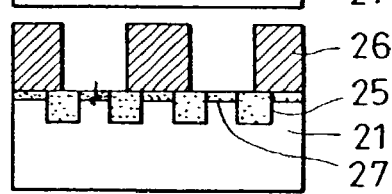
Figure 1:
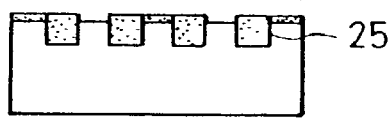
Figure 1:
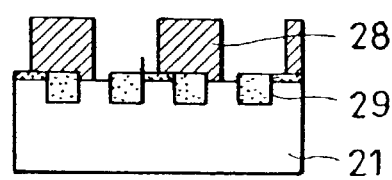
Figure 1:
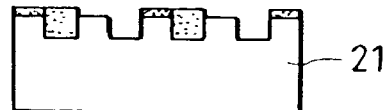
Figure 1:
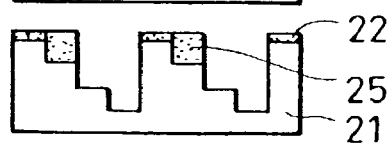
Figure 1:
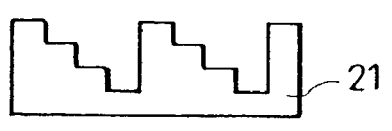

FIG. 1 shows a cross-sectional diagram of a manufacturing process of the diffraction optical device according to the first embodiment. In Step (1) of FIG. 1, a chromium film 22 is formed on a quartz substrate 21 as a thin film, by means of sputtering to a thickness of 100 nm, and following forming of a resist pattern 23 having a diffraction pattern of a reference cycle, an etching fluid comprised of a mixture of No. 2 cerium ammonium nitrate, perchloric acid, and water is used to remove the chromium film 22 which is not covered with the resist.

In Step (2) of FIG. 1, the quartz substrate 21 is etched to a certain depth to form a recessed portion 24, by means of the reactive ion etching (RIE) method using a mixed gas of $CF_4$ and hydrogen. In Step (3) of FIG. 1, the electron beam vapor deposition method is used to form an aluminum film 25 serving as a second thin film to fill the recessed portions 24 at a thickness to approximately match the surface of the remaining chromium film 22. Next, in Step (4) of FIG. 1, the resist pattern 23 and the aluminum film 25 thereupon are simultaneously removed by means of the lift-off method. With the process so far, a two-step structure of a diffraction pattern at a cycle serving as a reference has been formed, the surface of the quartz substrate has been covered with a neighboring chromium film 22 and an aluminum film 25, and the position and dimensions of the pattern have been stipulated.

Next, a resistant pattern 26 is formed in Step (5) of FIG. 1, and following removing of the chromium film 27 not covered by resist by means of etching fluid, the resist pattern 26 is removed in Step (6) of FIG. 1 using the same etching fluid as with Step (1). Further, a resist pattern 28 is formed in Step (7) of FIG. 1, and following removing of the certain aluminum film 29 neighboring the chromium film removed in Step (6) using an etching fluid of a mixture of phosphoric acid, nitric acid, acetic acid, and water, the resist pattern 28 is removed in Step (8) of FIG. 1.

In Step (9) of FIG. 1, the remaining chromium film 22 and aluminum film 24 are used as etching masks, and the quartz substrate 21 is etched to a certain depth with the same RIE method as with Step (2) as a self-alignment method wherein alignment is unnecessary. Finally, in Step (10) of FIG. 1, the chromium film 22 is removed using the same etching fluid as with Step (1), and the aluminum film is removed using the same etching fluid as with Step (6). Thus, a diffraction optical device having a high-precision, four-stepped, stair-like structure, without grooves or protrusions owing to alignment errors or pattern dimensions errors, can be realized.

Figure 2:
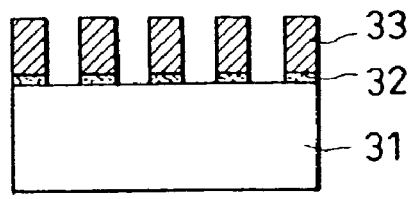
FIG. 2 is a cross-sectional diagram of a manufacturing process according to a second embodiment.
Figure 2:
Figure 2:
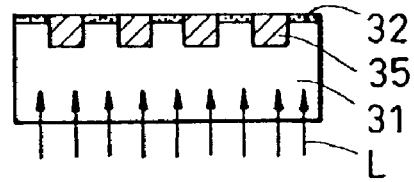
Figure 2:
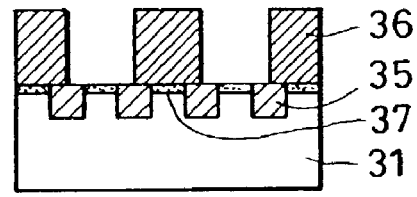
Figure 2:
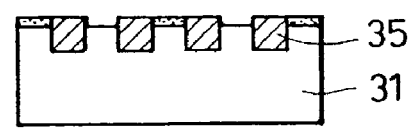
Figure 2:
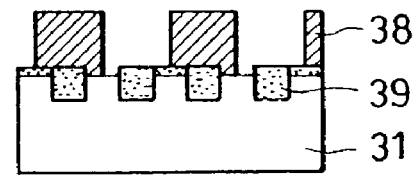
Figure 2:
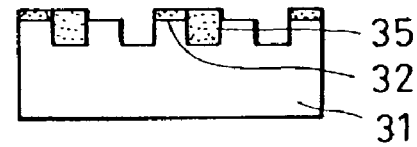
Figure 2:
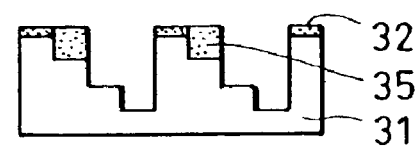
Figure 2:
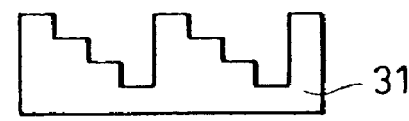

FIG. 2 shows a cross-sectional diagram of a manufacturing process of the diffraction optical device according to the second embodiment, using the photo-CVD method. In Step (1) of FIG. 2, a chromium film 32 is formed on a quartz substrate 31 as a first thin film, by means of sputtering to a thickness of 100 nm, and following forming of a resist pattern 33 having a diffraction pattern of a reference cycle, an etching fluid comprised of a mixture of No. 2 cerium ammonium nitrate, perchloric acid, and water is used to remove the chromium film 32 which is not covered with the resist pattern 33.

In Step (2) of FIG. 2, the quartz substrate 31 is etched to a certain depth to form a recessed portion 34, by means of the RIE method using a mixed gas of $CF_4$ and hydrogen. In Step (3) of FIG. 2, the photo-assisted chemical vapor phase deposition (photo CVD) method, which is performed while irradiating the rear side of the quartz substrate 31 (lower side of the Figure) with light, is used to form an aluminum film 35 serving as a second thin film to fill the recessed portions 34 at a thickness to approximately match the surface of the remaining chromium film 32, using a KrF laser beam 248 nm in wavelength, $Al(CH_3)_3$, and dinitrogen monoxide.

With the process so far, a two-step structure of a diffraction pattern at a cycle serving as a reference has been formed, the surface of the quartz substrate has been covered with a neighboring chromium film 32 and an aluminum film 35, and the position and dimensions of the pattern have been stipulated. Incidentally, the CVD method wherein light is case from the rear side is handier than other methods, since hole-filling can be carried out in a single self-alignment process.

Next, in Step (4) of FIG. 2, a certain resist pattern 36 is formed, and following removing the chromium film 37 on which the resist pattern 36 has not been formed is removed in Step (5) of FIG. 2 using the same etching fluid as with Step (1), the resist pattern 36 is removed. Further, in Step (6) of FIG. 2, a certain resist pattern 38 is formed, and following removing the and the part of the aluminum oxide film 35 neighboring the chromium film 32 which is the aluminum oxide film 39 is removed in Step (5) is removed using a phosphoric acid etching liquid, and then the resist pattern 38 is removed in Step (7) of FIG. 2.

Next, in Step (8) of FIG. 2, the remaining chromium film 32 and aluminum oxide film 35 are used as etching masks, and the quartz substrate 31 is etched to a certain depth with the same RIE method as with Step (2), the chromium film 32 is removed using the same etching fluid as with Step (1), and the aluminum oxide film 35 is removed using the same etching fluid as with Step (7). Thus, a diffraction optical device having a high-precision four-stepped stair-like structure without grooves or protrusions owing to alignment errors or pattern dimensions errors, can be realized, as shown in Step (9) of FIG. 2.

The CVD method used here can be carried out with various combinations of the quartz substrate 31 transmitting assisting light and various layered materials, such as quartz substrate 31 with titanium oxide, boron nitride, or aluminum. Also, a diffraction optical device having a high-precision four-stepped stair-like structure can be realized with the first chromium thin film in the present embodiment replaced with a chromium oxide deposited layer, and the aluminum oxide layer 35 in Step (3) with an aluminum film, using a selective deposition method.

FIG. 3 shows the cross-sectional diagram of a manufacturing process of a diffraction optical device according to a third embodiment, using the CMP or etch-back method. In Step (1) of FIG. 3, a chromium film 42 is formed on a quartz substrate 41 as a first thin film, by means of sputtering to a thickness of around 100 nm to 200 nm, and following forming of a resist pattern 43 having a diffraction pattern of a reference cycle, a mixed gas of chlorine and oxygen is used with the RIE method to remove the chromium film 42 which is not covered with the resist pattern 43. In Step (2) of FIG. 3, the resist pattern 43 is removed, and then the quartz substrate 41 is etched to a certain depth by means of the RIE method using a gas of a fluorocarbon such as $CF_4$, $CHF_3$, or $C_4F_8$. In Step (3) of FIG. 3, an aluminum film is formed to a thickness of around 25 nm to 500 nm as a second thin film by means of electron-beam vapor deposition, and the aluminum layer 44 is removed in Step (4) of FIG. 3 until the surface of the remaining chromium film 42 is exposed, by means of the DAMASCENE method using the chemical mechanical polishing (CMP) method, or the etch-back method with etching fluid.

According to the process so far, the diffraction pattern of a cycle serving as a reference is formed in a two-step structure on the pattern substrate 41, and the surface of the quartz substrate, and the surface of the quartz substrate 41 is covered with a neighboring chromium film 42 and aluminum film 44.

Next, in Step (5) of FIG. 3, following forming of the resist pattern 45 at the certain position, in Step (6) of FIG. 3 an etching fluid comprised of a mixture of No. 2 cerium ammonium nitrate, perchloric acid, and water is used to remove the chromium film 46 upon which is not formed the resist pattern 45, following which the resist pattern 45 is removed. Further, a resist pattern 47 is formed in Step (7) of FIG. 3, the aluminum film 48 neighboring the chromium film 46 removed in Step (6) is removed using the same etching fluid as that used in Step (4), and in Step (8) of FIG. 3, the resist pattern 47 is removed. In Step (9) of FIG. 3, the remaining chromium film and aluminum film 44 are masked, the quartz substrate 41 is etched using the same RIE method as with Step (2), forming a recessed portion 49. In the process so far, the diffraction pattern of a cycle serving as a reference is formed in a four-step structure on the pattern substrate 41.

Next, in Step (10) of FIG. 3, an aluminum layer 50 is formed to a thickness of around 25 nm to 500 nm in the same manner as with Step (3), following which the recessed portion 49 formed in Step (9) is filled in Step (11) of FIG. 3 according to the DAMASCENE method. Further, the aluminum film 50 is removed in the same manner as with Step (4). Next, a resist pattern 51 is formed at a certain position in Step (12) of FIG. 3, and the chromium film 52 without the resist pattern 51 is removed in Step (13) of FIG. 3 using etching fluid. Further, in Step (14) of FIG. 3, a resist pattern 53 is formed, the aluminum films 44 and 50 are removed in Step (15) of FIG. 3, and the resist pattern 53 is removed in Step (16) of FIG. 3.

Next, in Step (17) of FIG. 3, the remaining chromium film 42 and aluminum films 44 and 50 are masked, and the substrate 41 is etched according to the same RIE method as with Step (2). Finally, in Step (18) of FIG. 3, the remaining chromium film 42 is removed with the same etching fluid as with Step (1), and the aluminum films 44 and 50 are removed with the same etching fluid as with Step (4).

Thus, a diffraction optical device having a high-precision eight-stepped stair-like structure without grooves or protrusions owing to alignment errors or pattern dimensions errors, can be realized by the self-alignment method. Incidentally, the exposure light L for forming the patterns in the first through third embodiments is not restricted to ultraviolet or far ultraviolet light; rather, electron beams, X-ray, or other exposing techniques can be used.

The substrates 21 and 41 according to the first and third embodiments are selected appropriately according to the object of use, whether a transmitting type, reflecting type, or mold. However, the material to be etched, i.e., the substrate, and the material comprising the first and second thin films must be such which have completely different etching speeds and etching conditions in the etching methods to be used, and a ratio of selection must be obtainable. Regarding the etching method for the chromium film and the aluminum film, in addition to the wet etching method and RIE method, dry etching methods such as sputtering etching, ion beam etching, and so forth may be used, as well. Further, the following methods may be used for forming the first and second thin films in the first and third embodiments: vacuum vapor deposition, sputtering, ion-beam sputtering, ion plating, CVD, MBE, and so forth.

Figure 4:
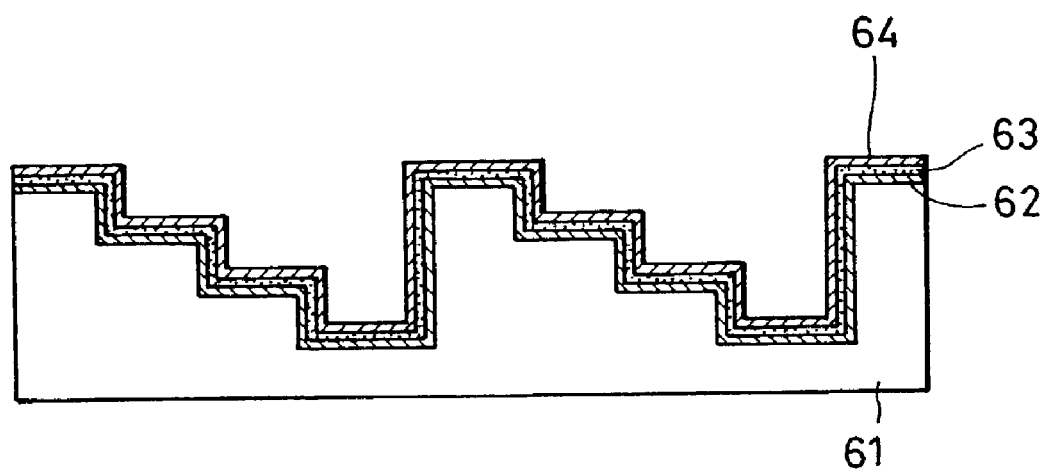
FIG. 4 is a cross-sectional diagram of a reflection-type diffraction optical device according to a fourth embodiment.

FIG. 4 is a cross-sectional diagram illustrating a reflective diffraction optical device according to a fourth embodiment of the present invention. As a reflective layer, a chromium layer 62, aluminum layer 63, and quartz layer 64 are layered by means of electron-beam vapor deposition on a substrate 61 having the multi-stepped structure formed in the first through third embodiments. The chromium layer 62 has the function of improving adherence to the substrate 61, the aluminum layer 63 is a reflective layer, and the quartz layer serves as a protective film. Silica or quartz or the like are used for the material of the substrate, and the material and layered structure of the reflective layer is selected such that the functions of each layer can be fully exhibited according to the wavelengths and environments used. Thus, a diffraction optical device having a high-precision four- or eight-stepped stair-like structure without grooves or protrusions owing to alignment errors or pattern dimensions errors, can be realized.

Figure 5:
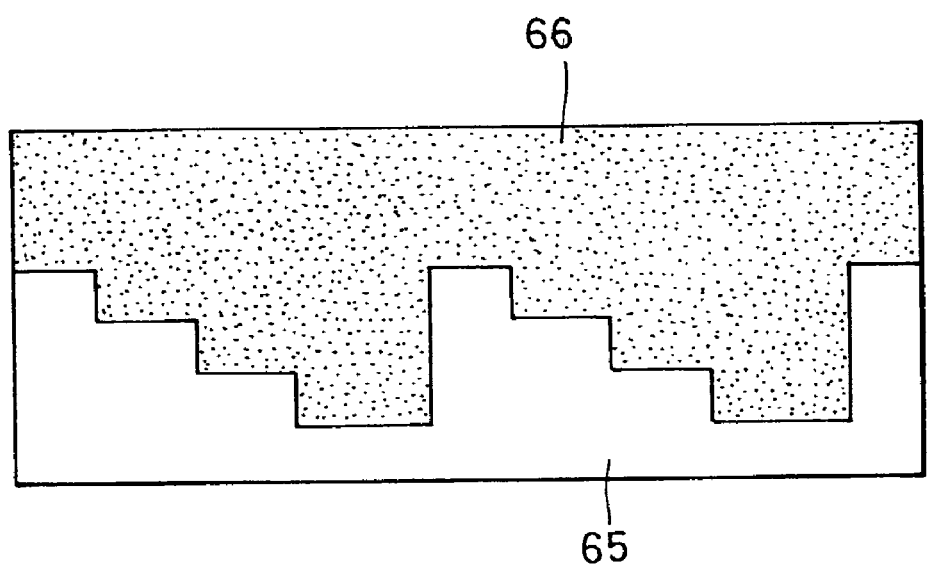
FIG. 5 is a cross-sectional diagram of a diffraction optical device according to a fifth embodiment.

FIG. 5 is a cross-sectional diagram illustrating a diffraction optical device according to a fifth embodiment of the present invention. A substrate 65 having the multi-stepped structure formed in the first through third embodiments is used as a mold, and a diffraction optical device is replicated using replicating technique such as the ZP method or injection method, using photo-setting resin or the like. Thus, a diffraction optical device having a high-precision four or eight-stepped stair-like structure without grooves or protrusions owing to alignment errors or pattern dimensions errors, can be realized. Further, it is more preferable that a reflection preventing film be formed on the diffraction optical device manufactured according to any of: the first through third Embodiments; and the fifth Embodiment.

FIG. 6 is a constructional diagram of a projecting optical system having a diffraction optical device. In FIG. 6, the diffraction optical device 72 according to the present invention is assembled into a common lens group 71 of spherical or non-spherical lenses, the surface of the common lenses 71 having a reflection preventing film formed thereupon.

The diffraction optical device 72 cooperates with the lenses 71 to various types of aberration in the optical system, such as color aberration and Seidel's five aberrations. Such projecting optical systems are used in various cameras, replacement lenses for single-reflex cameras, office equipment such as photocopiers, projection exposure devices for manufacturing liquid crystal panels, projection exposure devices for manufacturing semiconductor chips such as ICs, LCIs, and so forth.

FIG. 7 is a constructional diagram of a projecting optical system, and in FIG. 7, the illumination optical system 73 for providing exposure light, the mask 74 illuminated by the illumination optical system 73, the projecting optical system 75 for projecting a device pattern image drawn in the mask 74, and a glass substrate or silicone substrate 76 coated with a resist pattern, are arrayed. The diffraction optical device according to the present invention is assembled into the illumination optical system 73 and projecting optical system 75, and a reflection preventing film is formed in the surface of the lenses comprising the illumination optical system 73 and projecting optical system 75.

The exposure light from the illumination optical system 73 is cast onto the mask 74, and projects the device pattern image drawing on the mask 74 onto the glass substrate or silicone substrate 76 by means of the projecting optical system 75.

Figure 8:
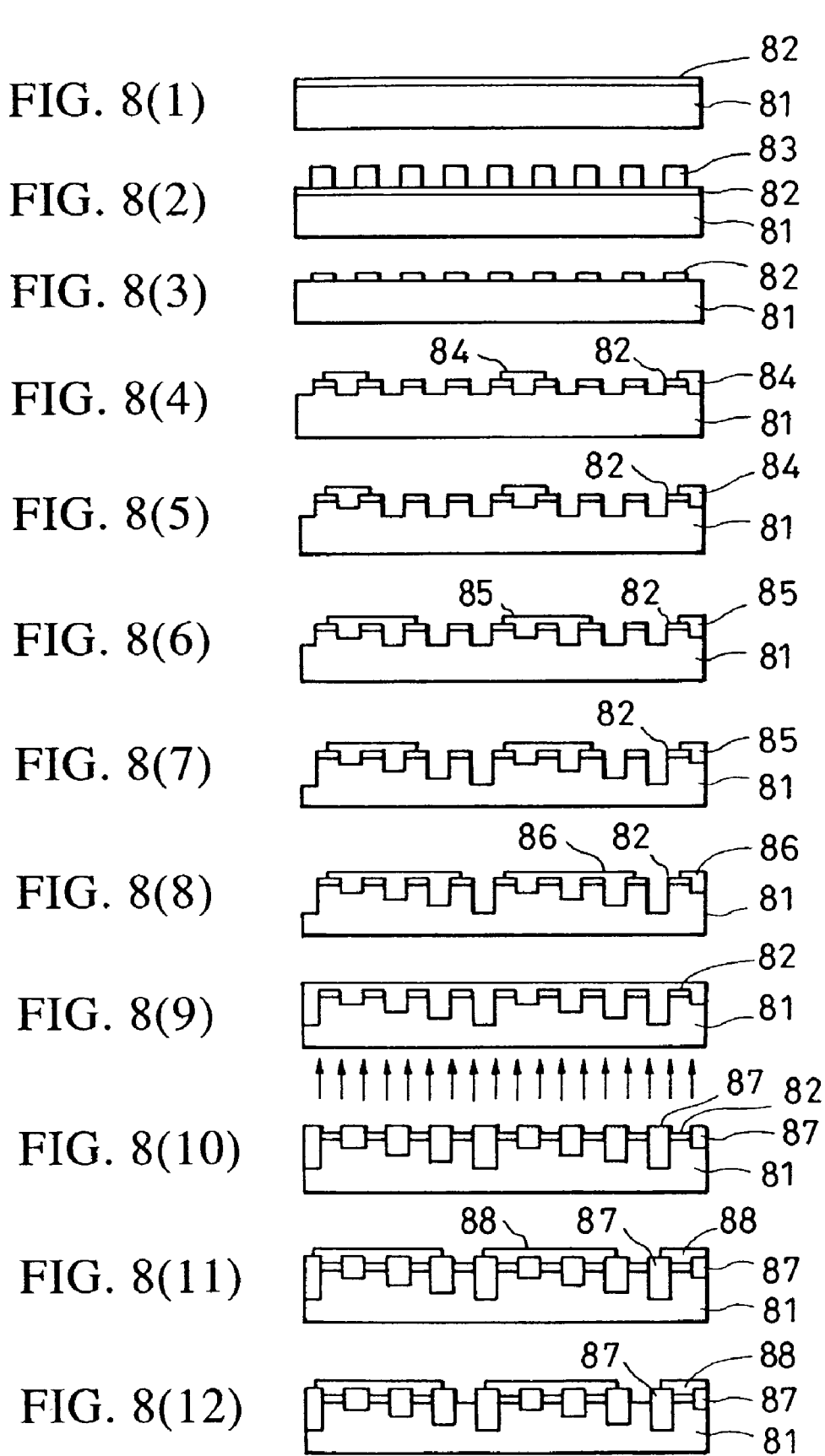
FIG. 8 is a cross-sectional diagram of a manufacturing process according to a sixth embodiment.
Figure 9:
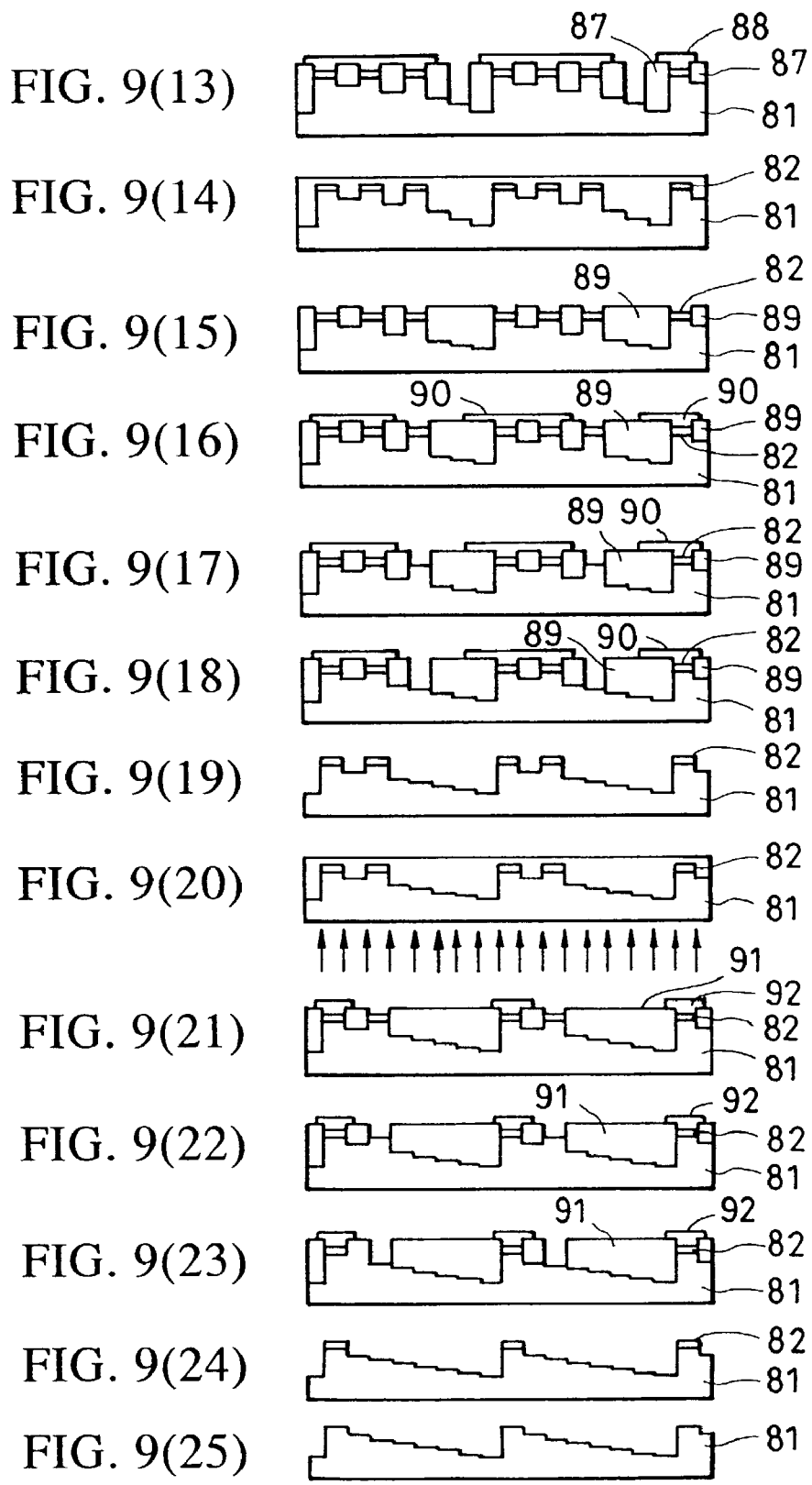
FIG. 9 is a cross-sectional diagram of a manufacturing process according to the sixth embodiment.

FIG. 8 and FIG. 9 show a cross-sectional diagram of the process for manufacturing diffraction optical devices by means of a technique of exposing the negative resist from the rear, according to the sixth embodiment. First, in Step (1) of FIG. 8, a chromium film 82 is formed on a quartz substrate 81 to a thickness of 100 nm by the sputtering method. Further, a reflection preventing layer such as chromium oxide or the like is formed on the chromium layer to a thickness of 20 to 30 nm, in order to improve patterning resolution. In Step (2) of FIG. 8, photo-resist is applied to this quartz substrate 81, and a first resist pattern 83 is formed with both the line width and space width at 0.35 μm. Next, the chromium film 82 is etched with the resist pattern 83 as a mask, by means of a parallel plate-type RIE device using chlorine gas or a mixed gas of chlorine gas and oxygen. Next, in Step (3) of FIG. 8, the resist pattern 83 is peeled away by means of the oxygen ashing method or with a peeling fluid. The pattern of this chrome film 82 defines all of the step positions throughout all of the following steps.

In Step (4) of FIG. 8, with the pattern of the chromium film 82 as a mask, a parallel plate-type RIE device, for example, using a mixed gas of $CF_4$ and hydrogen is used to etch the quartz substrate 81 by 61 nm in five minutes, under the conditions of: flow of $CF_4$ at 20 $cm^3$/min, flow of hydrogen at 3 $cm^3$/min, pressure at 4 Pa, and RF power of 60 W. Next, photo-resist is applied to the substrate 81 and the second resist pattern 84 is formed. The alignment precision at this time needs only to be half of the line width of the pattern of the chromium film 82, so this can be achieved with a standard exposing device. This can be applied to all patterning from the second time on, including other embodiments, as well.

Next, in Step (5) of FIG. 8, the quartz substrate 81 is etched by 61 nm using the chromium film 82 pattern and resist pattern 84 as a mask. Following peeling of the resist 84 in Step (6) in FIG. 8, photo-resist is applied again and the third resist pattern 85 is formed. Then, in Step (7) of FIG. 8, the quartz substrate 81 is etched by 61 nm using the chromium film 82 and resist pattern 85 as a mask. Following peeling of the resist 85, photo-resist is applied again and the fourth resist pattern 86 is formed.

In Step (8) of FIG. 8, the quartz substrate 81 is etched by 61 nm using the resist pattern 86 and the chromium film 82 pattern as a mask. Next in Step (9) of FIG. 8, applying negative resist and exposing from the rear side and developing enables the resist pattern 87 to remain only where there is no chromium pattern, as shown in Step (10) of FIG. 8. At this time, the chromium pattern itself serves as the contact mask for exposure of the negative resist, so completely accurate alignment can be performed.

Next, photo-resist is applied thereupon, and the fifth resist 88 is formed, as shown in Step (11) of FIG. 8. In Step (12) of FIG. 8, the portions of the chromium film not covered with the resist pattern 87 and 88 are etched away using an etching fluid comprised of a mixture of cerium ammonium nitrate, perchloric acid, and water. Further, in Step (13) of FIG. 8, the quartz substrate 81 is etched by 366 nm in 30 minutes with the resists 87 and 88 as masks, using the same RIE device and etching gas as with Step (3), and under the same conditions as with Step (3). In Step (14) of FIG. 9, following removal of the resist patterns 87 and 88 by the ashing method, negative-resist is applied thereto and is exposed from the rear side. Developing this in Step (15) of FIG. 9 enables leaving resist pattern 89 only where there is no chromium pattern.

In Step (16) of FIG. 9, photo-resist is applied thereupon, and the sixth resist 90 is formed. In Step (17) of FIG. 9, the portions of the chromium film not covered with the resist pattern 89 and 90 are etched away using the same mixture fluid as with Step (12). Further, in Step (18) of FIG. 9, the quartz substrate 81 is etched by 244 nm in 20 minutes with the resists 89 and 90 as masks, using the same RIE device and etching gas as with Step (3), and under the same conditions as with Step (3). In Step (19) of FIG. 9, following removal of the resist patterns 89 and 90 by the ashing method, negative-resist is applied thereto and is exposed from the rear side and developed in Step (20) of FIG. 9, which, as shown in Step (21) of FIG. 9, enables leaving resist pattern 91 only where there is no chromium pattern.

Next, photo-resist is applied thereupon, and the seventh resist 92 is formed. In Step (22) of FIG. 9, the portions of the chromium film not covered with the resist pattern 91 and 92 are etched away using the same mixture fluid as with Step (12). Further, in Step (23) of FIG. 9, the quartz substrate 81 is etched by 122 nm in 10 minutes with the resists 91 and 92 as masks, using the same RIE device and etching gas as with Step (3), and under the same conditions as with Step (3). In Step (24) of FIG. 9, the resist patterns 91 and 92 are removed by the ashing method. Etching of the pattern of the chromium film 82 is performed using the same mixture fluid as with Step (12), thereby completing a diffraction optical device having an eight-stepped stair-like structure, or a mold for manufacturing such a diffraction optical device.

The diffraction optical device thus completed with a minimum line width of 0.35 μm and step offset of 61 nm was measured for diffraction efficiency at a usage wavelength of 248 nm, and the results showed that the diffraction efficiency minus loss owing to reflection was 93%, which is a 2% reduction in diffraction efficiency as compared to the ideal value. The main cause for this reduction in diffraction efficiency was due to margin of error in the line width of the first chromium pattern.

Figure 10:
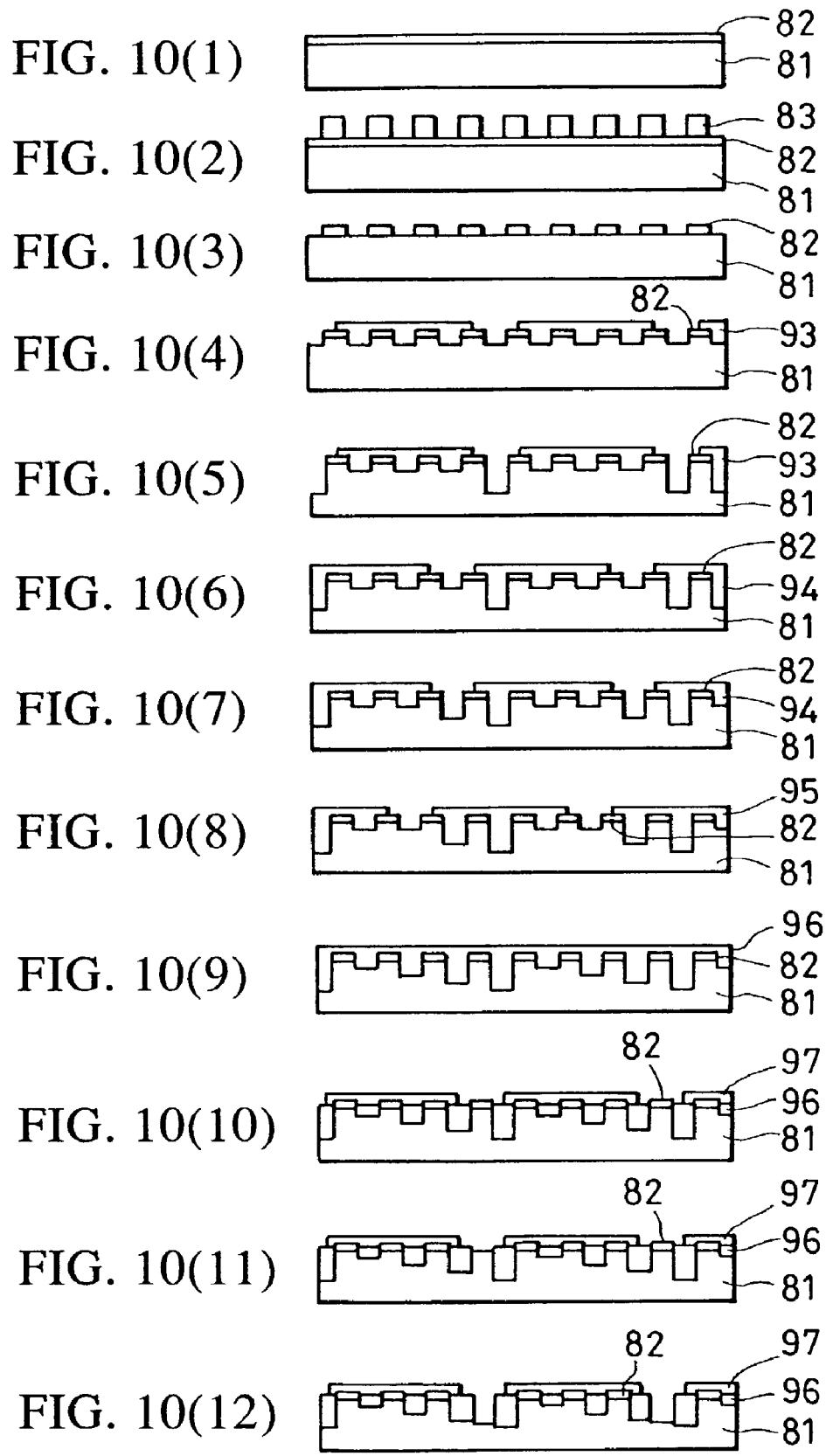
FIG. 10 is a cross-sectional diagram of a manufacturing process according to a seventh embodiment.
Figure 11:
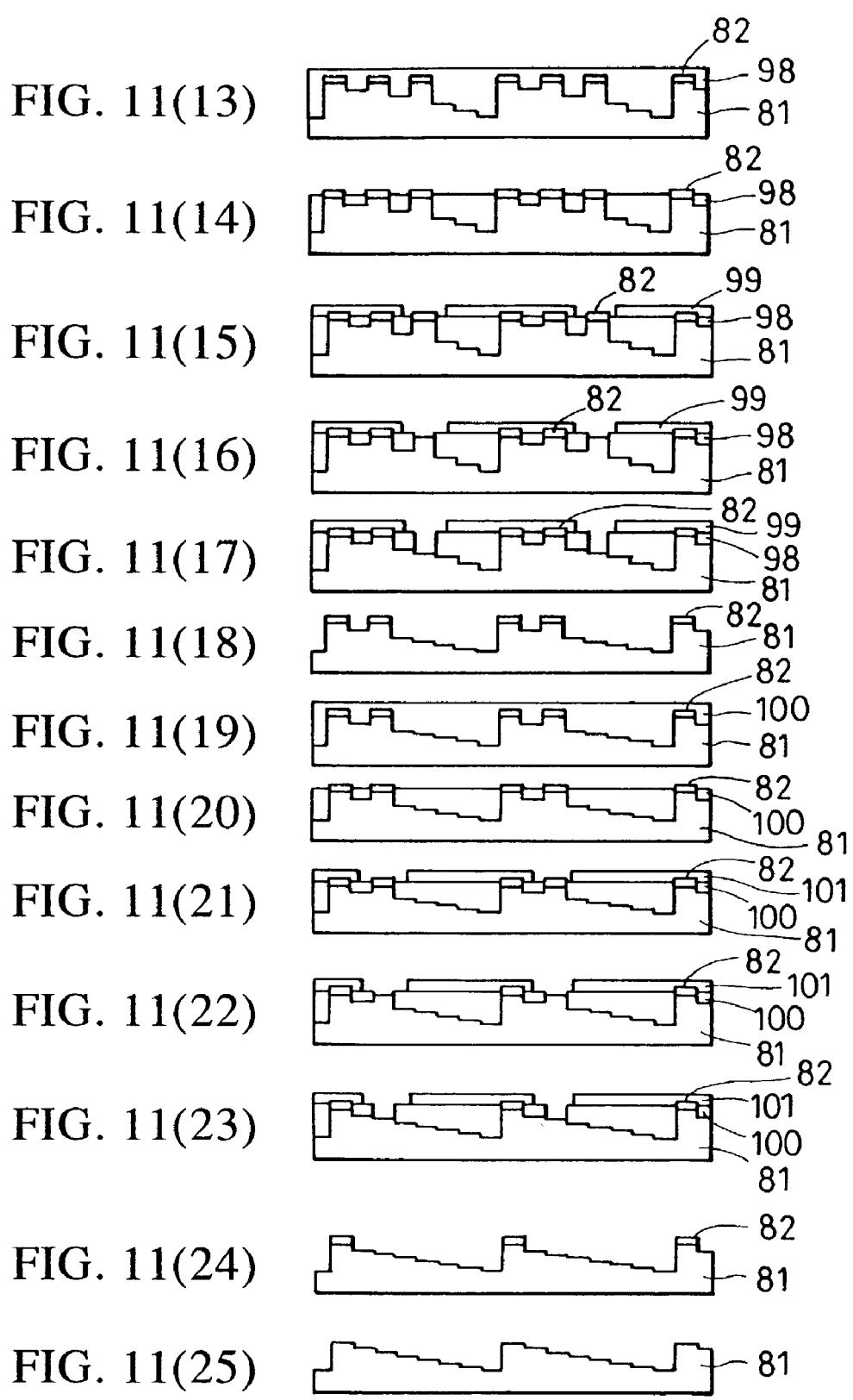
FIG. 11 is a cross-sectional diagram of a manufacturing process according to the seventh embodiment.

FIG. 10 and FIG. 11 show a cross-sectional diagram of the process for manufacturing diffraction optical devices according to the seventh embodiment. Step (1) through Step (3) in FIG. 10 is the same as Step (1) through Step (3) in FIG. 9 in the sixth embodiment, thereby forming the first resist pattern and completing the chromium pattern.

In Step (4) of FIG. 10, photo-resist is applied to the substrate 81 and the second resist pattern 93 is formed. Next, in Step (5) of FIG. 10, the quartz substrate is etched by 366 nm with the resist pattern 93 and the chromium film 82 pattern as masks. In Step (6) of FIG. 10, following peeling of the resist 93, photo-resist is again applied to the substrate 81 and the third resist pattern 94 is formed. Next, in Step (7) of FIG. 10, the quartz substrate 81 is etched by 244 nm with the resist pattern 94 and the chromium film 82 pattern as masks. Next, following peeling of the resist 94, photo-resist is again applied and the fourth resist pattern 95 is formed.

In Step (8) of FIG. 10, the quartz substrate 81 is etched by 122 nm with the resist pattern 95 and the chromium film 82 pattern as masks. In Step (9) of FIG. 10, following peeling of the resist 95, a polyimide film 96 is applied to the entire surface to a thickness of approximately 1 μm by means of the spin-coating method. Next, the polyimide film 96 is etched back by means of oxygen-plasma ashing until the surface of the pattern of the chromium film 82 is exposed. In Step (10) of FIG. 10, a resist pattern is applied, forming the fifth resist pattern 97 by means of lithography method. In Step (11) of FIG. 10, the portions of the chromium film not covered with the resist pattern 97 and the polyimide film 96 are etched away using an etching fluid comprised of a mixture of cerium ammonium nitrate, perchloric acid, and water, for example. In Step (12) of FIG. 10, with the resist pattern 97 and the polyimide film 96 as a mask, a parallel plate-type RIE device, for example, using a mixed gas of $CF_4$ and hydrogen is used to etch the quartz substrate 81 by 366 nm in 30 minutes, under the conditions of: flow of $CF_4$ at 20 cm³/min, flow of hydrogen at 3 cm³/min, pressure at 4 Pa, and RF power of 60 W.

In Step (13) of FIG. 10, following peeling of the resist pattern 97 and the polyimide film 96, a polyimide film 98 is applied to the entire surface to a thickness of approximately 1 μm by means of the spin-coating method. In Step (14) of FIG. 11, the polyimide film 98 is etched back until the surface of the pattern of the chromium film 82 is exposed. Next, in Step (15) of FIG. 11, a resist pattern is applied, forming the sixth resist pattern 99 by means of lithography method. In Step (16) of FIG. 11, the portions of the chromium film not covered with the resist pattern 99 and the polyimide film 98 are etched away using an etching fluid the same as that used in Step (11).

In Step (17) of FIG. 11, with the resist pattern 99 and the polyimide film 98 as a mask, a parallel plate-type RIE device, and etching gas, the same as those used in Step (12), are used to etch the quartz substrate 81 by 244 nm in 20 minutes, under the same etching conditions. In Step (18) of FIG. 11, the resist pattern 99 and the polyimide film 98 are peeled away. Then, polyimide film 100 is applied to the entire surface to a thickness of approximately 1 μm by means of the spin-coating method. In Step (20) of FIG. 11, the polyimide film 100 is etched back by means of oxygen-plasma ashing until the surface of the pattern of the chromium film 82 is exposed. Next, in Step (21) of FIG. 11, a resist pattern is applied, forming the seventh resist pattern 101 by means of lithography method.

In Step (22) of FIG. 11, the portions of the chromium film not covered with the resist pattern 101 and the polyimide film 100 are etched away using an etching fluid the same as that used in Step (11). In Step (23) of FIG. 11, with the resist pattern 101 and the polyimide film 100 as a mask, a parallel plate-type RIE device, and etching gas, the same as those used in Step (12), are used to etch the quartz substrate 81 by 122 nm in 10 minutes, under the same etching conditions. In Step (24) of FIG. 11, the resist patterns 101 and polyimide film 100 are removed by the ashing method. Etching of the pattern of the chromium film 82 is performed using the same mixture fluid as with Step (11), thereby completing a diffraction optical device having an eight-stepped stair-like structure, or a mold for manufacturing such a diffraction optical device, as shown in Step (25) of FIG. 11.

Figure 12:
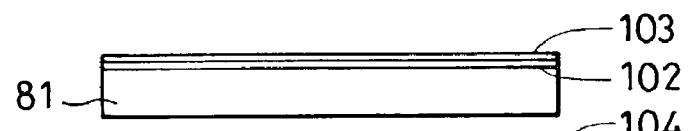
FIG. 12 is a cross-sectional diagram of a manufacturing process according to an eighth embodiment.
Figure 12:
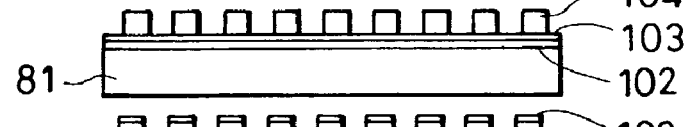
Figure 12:
Figure 12:
Figure 12:
Figure 12:
Figure 12:
Figure 12:
Figure 12:
Figure 12:
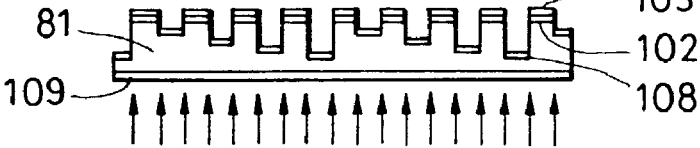
Figure 12:
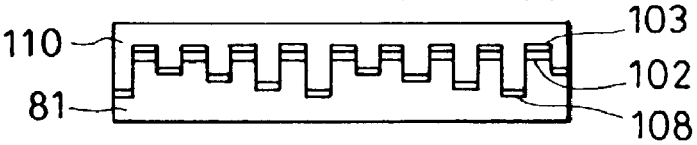
Figure 12:
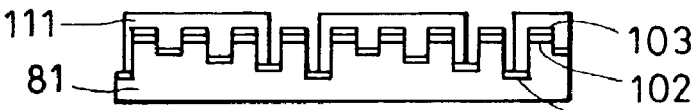
Figure 12:
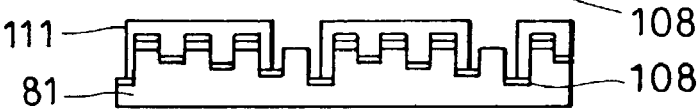
Figure 12:
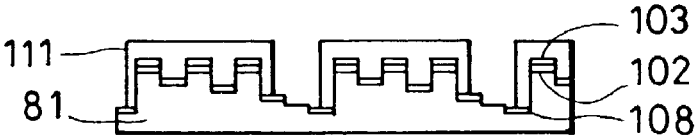

FIG. 12 shows a cross-sectional diagram of the process for manufacturing diffraction optical devices by means of the photo-CVD method, according to the eighth embodiment. In Step (1) of FIG. 12, a chromium film 102 is formed on a quartz substrate 81 to a thickness of 100 nm by the sputtering method. Further, a chromium oxide layer is formed on the chromium layer to a thickness of 20 to 30 nm. This chromium oxide layer reduces exposing light reflected by the quartz substrate 81 in subsequent patterning steps, thereby improving patterning resolution. In Step (2) of FIG. 12, photo-resist is applied to this quartz substrate 81, and a first resist pattern 104 is formed with both the line width and space width at 0.35 μm. Next, the chromium film 102 and chromium oxide film 103 is etched with the resist pattern 104 as a mask, by means of a parallel plate-type RIE device using chlorine gas or a mixed gas of chlorine gas and oxygen. Next, the resist 104 is peeled away, completing a chromium oxide/chromium pattern such as shown in Step (3) of FIG. 12. The pattern of this chromium oxide/chromium pattern defines all of the step positions throughout all of the following steps.

In Step (4) of FIG. 12, with the pattern of the chromium film 102 and chromium oxide film 103 as a mask, a parallel plate-type RIE device, for example, using a mixed gas of $CF_4$ and hydrogen is used to etch the quartz substrate 81 by 61 nm in five minutes, under the conditions of: flow of $CF_4$ at 20 cm$^3$/min, flow of hydrogen at 3 cm$^3$/min, pressure at 4 Pa, and RF power of 60 W. Next, photo-resist is applied to the substrate 81 and the second resist pattern 105 is formed. Next, in Step (5) of FIG. 12, the quartz substrate 81 is etched by 366 nm using the chromium film 102 and chromium oxide film 103 as a mask. Following peeling of the resist 105 in Step (6) in FIG. 12, photo-resist is applied again and the third resist pattern 106 is formed.

Then, in Step (7) of FIG. 12, the quartz substrate 81 is etched by 244 nm using the resist pattern 106, chromium film 102, and chromium oxide film 103 as a mask. Following peeling of the resist 106 in Step (8) in FIG. 12, photo-resist is applied again and the fourth resist pattern 106 is formed. Then, the quartz substrate 81 is etched by 122 nm using the resist pattern 107, chromium film 102, and chromium oxide film 103 as a mask. Next, in Step (9) of FIG. 12, the resist pattern 107 is removed by means of the oxygen-plasma ashing method or with a peeling fluid.

In Step (10) of FIG. 12, the substrate in the state of Step (9) is exposed to ultraviolet rays, e.g., a Kr F laser beam, from the rear side in an $Al_2(CH_3)_6$ gas. This allows forming of an aluminum film 108 to a thickness of 20 to 100 nm, only at the portion where there is no chromium film 102 or chromium oxide film 103. At this time, there is also precipitation of an aluminum film 109 on the rear side, as well. In Step (11) of FIG. 12, following application of a resist pattern film 110 thereupon, the aluminum film 109 on the rear side is removed using a mixed fluid of phosphoric acid, nitric acid, acetic acid, and water. In Step (12) of FIG. 12, following removal of the resist pattern 110, photo-resist is applied thereupon and exposed and developed, thereby forming the fifth resist 111.

Figure 13:
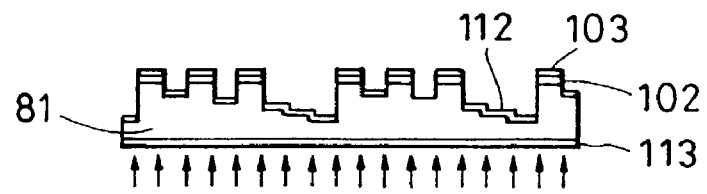
FIG. 13 is a cross-sectional diagram of a manufacturing process according to the eighth embodiment.
Figure 13:
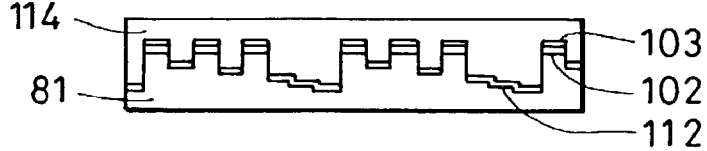
Figure 13:
Figure 13:
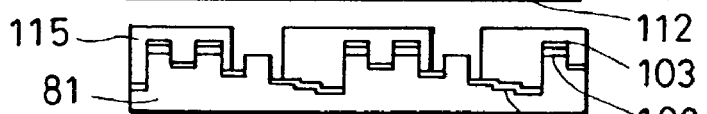
Figure 13:
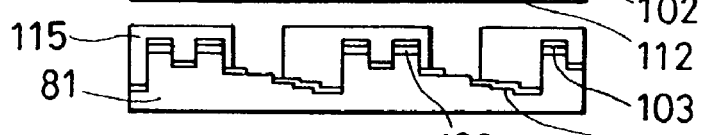
Figure 13:
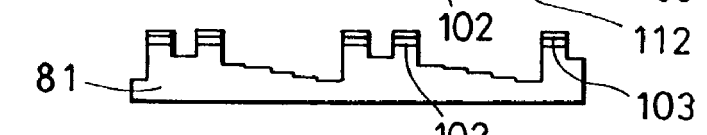
Figure 13:
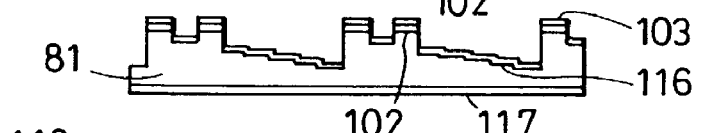
Figure 13:
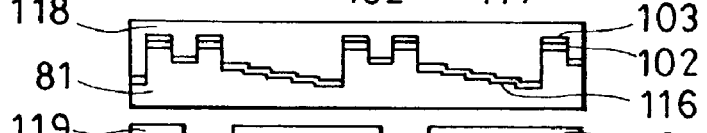
Figure 13:
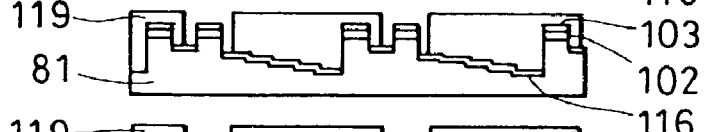
Figure 13:
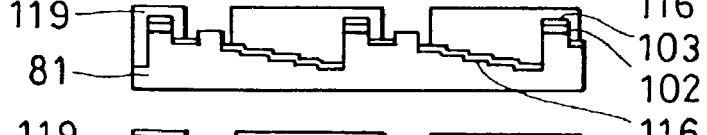
Figure 13:
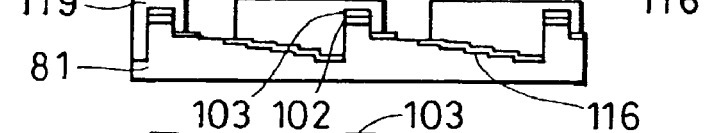
Figure 13:
Figure 13:
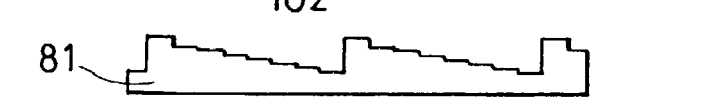

In Step (13) of FIG. 13, the portions of the chromium film 102 and chromium oxide film 103 not covered with the resist pattern 111 and the aluminum film 108 are removed by etching. Next, in Step (14) of FIG. 13, a parallel plate-type RIE device, and etching gas, the same as those used in Step (4), are used to etch the quartz substrate 81 by 366 nm in 30 minutes, under the same etching conditions, with the resist pattern 111 and aluminum film 108 as a mask.

In Step (15) of FIG. 13, the resist pattern 111 is removed by means of the ashing method or with a peeling fluid, and following removing the aluminum film 108 with a mixture fluid the same as that of Step (11), the substrate is exposed to ultraviolet rays, e.g., a Kr F laser beam, from the rear side in an $Al_2(CH_3)_6$ gas. This allows forming of an aluminum film 112 to a thickness of 20 to 100 nm, only at the portion where there is no chromium film 102 or chromium oxide film 103. At this time, there is also precipitation of an aluminum film 113 on the rear side, as well. In Step (16) of FIG. 13, following application of a resist pattern film 114 thereupon, the aluminum film 113 on the rear side is removed using the same mixed fluid as that used in Step (11). In Step (17) of FIG. 13, following removal of the resist pattern 114, photo-resist is applied thereupon and exposed and developed, thereby forming the sixth resist 115.

In Step (18) of FIG. 13, the portions of the chromium film 102 and chromium oxide film 103 not covered with the resist pattern 115 and the aluminum film 112 are removed by etching with an etching fluid comprised of a mixture of cerium ammonium nitrate, perchloric acid, and water, for example. Next, in Step (19) of FIG. 13, a parallel plate-type RIE device, and etching gas, the same as those used in Step (4), are used to etch the quartz substrate 81 by 224 nm in 20 minutes, under the same etching conditions, with the resist pattern 115 and aluminum film 112 as a mask. The resist pattern 115 is removed by means of the ashing method or with a peeling fluid, and the aluminum film 112 is removed by etching with a mixed fluid the same as that used in Step (11), resulting in the state shown in Step (20) of FIG. 13.

This substrate is exposed to ultraviolet rays, e.g., a Kr F laser beam, from the rear side in an $Al_2(CH_3)_6$ gas. This allows forming of an aluminum film 116 to a thickness of 10 to 20 nm, only at the portion where there is no chromium film 102 or chromium oxide film 103, as shown in Step (22) of FIG. 13. At this time, there is also precipitation of an aluminum film 117 on the rear side, as well. In Step (22) of FIG. 13, following application of a resist pattern film 118 thereupon, the aluminum film 117 on the rear side is removed using the same mixed fluid as that used in Step (11). In Step (23) of FIG. 13, following removal of the resist pattern 118, photo-resist is applied thereupon and exposed and developed, thereby forming the seventh resist 119.

In Step (24) of FIG. 13, the portions of the chromium film 102 and chromium oxide film 103 not covered with the resist pattern 119 and the aluminum film 116 are removed by etching with a mixed fluid the same as that used in Step (18). Next, in Step (25) of FIG. 13, a parallel plate-type RIE device, and etching gas, the same as those used in Step (4), are used to etch the quartz substrate 81 by 122 nm in 10 minutes, under the same etching conditions, with the resist pattern 119 and aluminum film 116 as a mask. The resist pattern 119 is removed by means of the ashing method or with a peeling fluid in Step (26) of FIG. 13, and the aluminum film 116 is removed by etching with a mixed fluid the same as that used in Step (11). In Step (27) of FIG. 13, the chromium film 102 and chromium oxide film 103 are etched with a mixed fluid the same as that used in Step (18), thereby completing a diffraction optical device having an eight-stepped stair-like structure, or a mold for manufacturing such a diffraction optical device.

The diffraction optical device thus completed with a minimum line width of 0.35 μm and step offset of 61 nm was measured for diffraction efficiency at a usage wavelength of 248 nm, and the results showed that the diffraction efficiency minus loss owing to reflection was 93%, which is a 2% reduction in diffraction efficiency as compared to the ideal value. The main cause for this reduction in diffraction efficiency was due to margin of error in the line width of the first chromium pattern, and defective reproduction in etching.

Figure 14:
FIG. 14 is a cross-sectional diagram of a manufacturing process according to a ninth embodiment.
Figure 14:
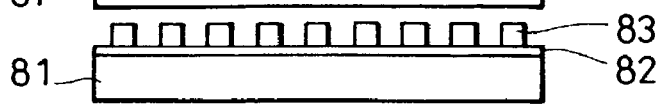
Figure 14:
Figure 14:
Figure 14:
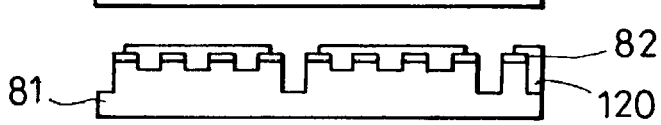
Figure 14:
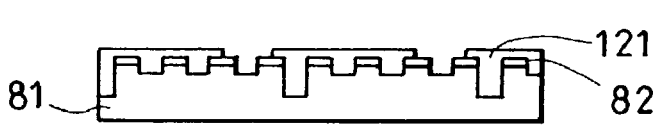
Figure 14:
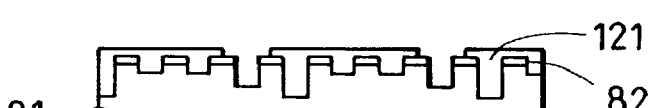
Figure 14:
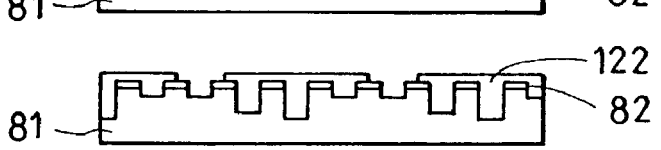
Figure 14:
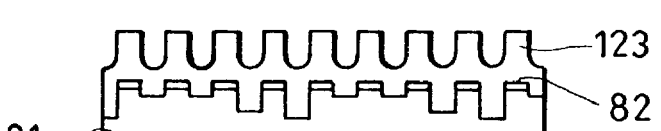
Figure 14:
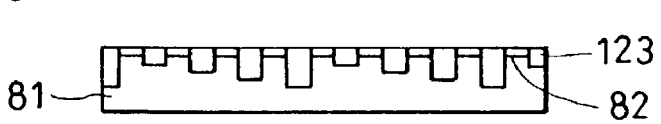
Figure 14:
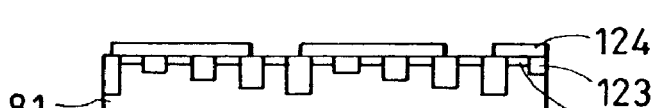
Figure 14:
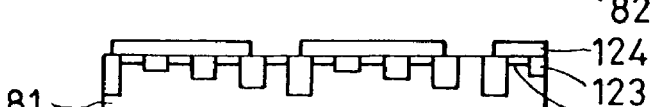
Figure 14:
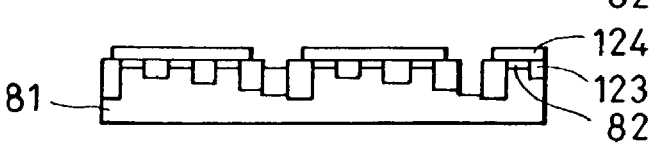
Figure 15:
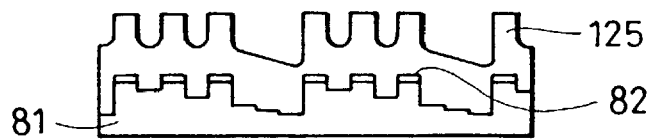
FIG. 15 is a cross-sectional diagram of a manufacturing process according to the ninth embodiment.
Figure 15:
Figure 15:
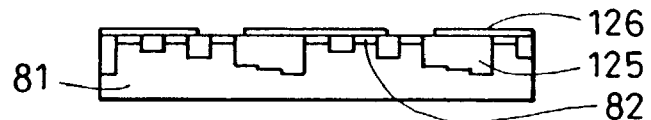
Figure 15:
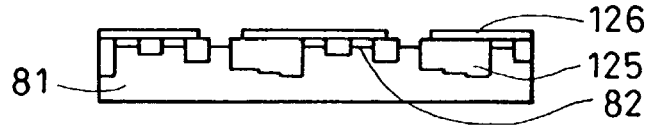
Figure 15:
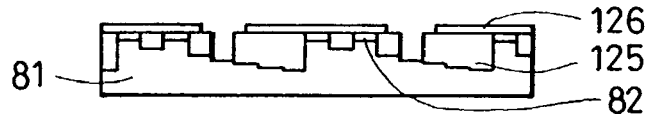
Figure 15:
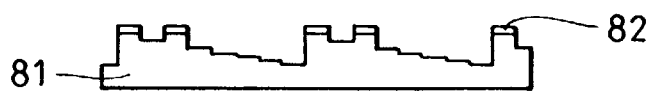
Figure 15:
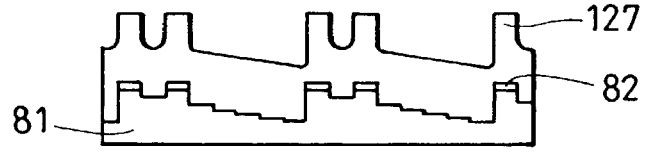
Figure 15:
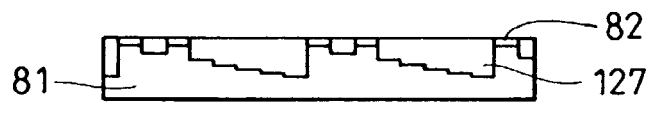
Figure 15:
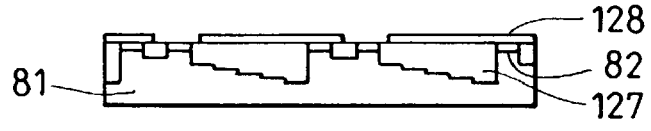
Figure 15:
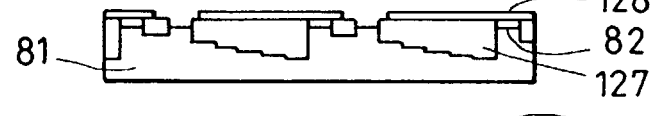
Figure 15:
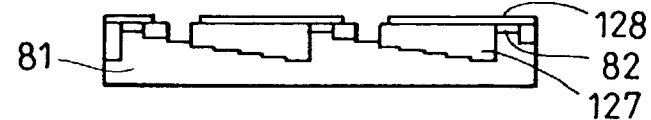
Figure 15:
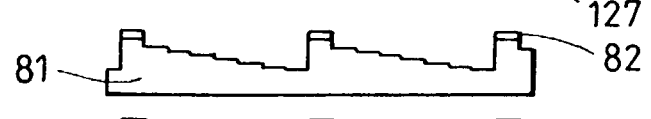

FIG. 14 and FIG. 15 show cross-sectional diagrams of the process for manufacturing diffraction optical devices by means of the DAMASCENE method using aluminum, according to the ninth embodiment.

In the same manner as with the sixth embodiment, photo-resist is applied to the substrate 81 in Step (1) of FIG. 14, a first resist pattern 83 is formed in Step (2) of FIG. 14 by means of photo-lithography, and in Step (3) of FIG. 14, the resist pattern 83 is masked and the chrome film 82 is etched.

In Step (4) of FIG. 14, with the pattern of the chromium film 82 as a mask, the quartz substrate 81 is etched by 61 nm. Next, photo-resist is applied to the substrate 81 and the second resist pattern 120 is formed by means of photo-lithography. In Step (5) of FIG. 14, the quartz substrate 81 is etched by 366 nm using the resist pattern 120 and chromium film 82 as a mask. Following peeling of the photo-resist 120 in Step (6) in FIG. 14, photo-resist is applied again and the third resist pattern 121 is formed. In Step (7) of FIG. 14, the quartz substrate 81 is etched by 244 nm using the resist pattern 121 and chromium film 82 pattern as a mask. Next, following peeling of the resist 106, photo-resist is applied again and the fourth resist pattern 122 is formed.

In Step (8) of FIG. 14, the quartz substrate 81 is etched by 122 nm using the resist pattern 122 and chromium film 82 as a mask. Then, the resist pattern 122 is removed by means of the oxygen-plasma ashing method or with a peeling fluid. In step (9) of FIG. 14, an aluminum film 123 is formed to a thickness of 1.5 μm by means of the sputtering method. Then, polishing the aluminum film 123 with a lapping machine under the conditions of 30 rpm and 50 g/cm$^3$, using a cerium oxide polishing agent of a 5/100 μm grain and a urethane sheet polishing cloth, until the surface of the chromium film 82 is exposed, yields the state such as shown in Step (10) of FIG. 14. In Step (11) of FIG. 13, photo-resist is applied thereupon and exposed and developed, thereby forming the fifth resist 124. In Step (12) of FIG. 14, the portions of the chromium film 102 not covered with the resist pattern 124 and the aluminum film 123 are removed by etching with an etching fluid comprised of a mixture of cerium ammonium nitrate, perchloric acid, and water, for example.

In Step (13) of FIG. 14, with the resist pattern 124 and aluminum film 123 as a mask, a parallel plate-type RIE device, for example, using a mixed gas of CF$_4$ and hydrogen is used to etch the quartz substrate 81 by 366 nm in 30 minutes, under the conditions of: flow of CF$_4$ at 20 cm$^3$/min, flow of hydrogen at 3 cm$^3$/min, pressure at 4 Pa, and RF power of 60 W. After the resist pattern 124 and aluminum film 123 are removed in Step (14) of FIG. 15, an aluminum film 125 is formed to a thickness of 1.5 μm by means of the sputtering method. Then, polishing the aluminum film 125 with the same lapping machine under the same conditions as Step (9), until the surface of the chromium film 82 is exposed, yields the state such as shown in Step (15) of FIG. 15. In Step (16) of FIG. 15, photo-resist is applied thereupon and exposed and developed, thereby forming the fifth photo-resist 126.

In Step (17) of FIG. 15, the portions of the chromium film 82 not covered with the resist pattern 126 and the aluminum film 125 are removed by etching with the same etching fluid as Step (11). In Step (18) of FIG. 15, with the resist pattern 126 and aluminum film 125 as a mask, an RIE device the same as that used in Step S(13) is used to etch the quartz substrate 81 by 244 nm in 20 minutes, under the same etching conditions.

Next, the resist pattern 126 is removed by means of the ashing method or with a peeling fluid, the aluminum film 125 is removed using a mixed fluid of phosphoric acid, nitric acid, acetic acid, and water, yielding the state shown in Step (19) of FIG. 15. In Step (20) of FIG. 15, an aluminum film 127 is formed to a thickness of 1.5 μm by means of the sputtering method. Then, polishing the aluminum film 127 with the same lapping machine under the same conditions as Step (9), until the surface of the chromium film 82 is exposed, yields the state such as shown in Step (21) of FIG. 15. In Step (22) of FIG. 15, photo-resist is applied thereupon and exposed and developed, thereby forming the sixth resist 126.

In Step (23) of FIG. 15, the portions of the chromium film 102 not covered with the resist pattern 48 and the aluminum film 127 are removed by etching with the same etching fluid as Step (11). Next, in Step (24) of FIG. 15, with the resist pattern 28 and aluminum film 127 as a mask, an RIE device the same as that used in Step (13) is used to etch the quartz substrate 81 by 122 nm in 10 minutes, under the same etching conditions. Next, the resist pattern 48 is removed by means of the ashing method or with a peeling fluid, the aluminum film 127 is removed using a mixed fluid the same as that used in Step (19), yielding the state shown in Step (25) of FIG. 15. In Step (26) of FIG. 15, the chromium film 102 is etched with a mixed fluid the same as that used in Step (11), thereby completing a diffraction optical device having an eight-stepped stair-like structure, or a mold for manufacturing such a diffraction optical device.

The diffraction optical device thus completed with a minimum line width of 0.35 μm and step offset of 61 nm was measured for diffraction efficiency at a usage wavelength of 248 nm, and the results showed that the diffraction efficiency minus loss owing to reflection was 93%, which is a 2% reduction in diffraction efficiency as compared to the ideal value. The main cause for this reduction in diffraction efficiency was due to margin of error in the line width of the first chromium pattern, and defective reproduction in etching.

Figure 16:
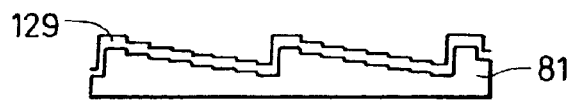
FIG. 16 is a cross-sectional diagram of a reflection-type diffraction optical device according to a tenth embodiment.

FIG. 16 shows a cross-sectional drawing of a reflective stepped diffraction optical device according to a tenth embodiment. The reflective stepped diffraction optical device such as shown in FIG. 16 is completed by using the sputtering method to form a 100 nm aluminum film on: a stair-like substrate such as shown in FIG. 8 and FIG. 9 manufactured according to the sixth embodiment, a stair-like substrate such as shown in FIG. 10 and FIG. 11 manufactured according to the seventh embodiment, a stair-like substrate such as shown in FIG. 12 and FIG. 13 manufactured according to the eighth embodiment, or a stair-like substrate such as shown in FIG. 14 and FIG. 15 manufactured according to the ninth embodiment.

The diffraction optical device thus completed with a minimum line width of 0.35 μm and step offset of 61 nm was measured for diffraction efficiency at a usage wavelength of 248 nm, and the results showed that the diffraction efficiency minus loss owing to reflection was 91%, which is a 4% reduction in diffraction efficiency as compared to the ideal value. The main cause for this 4% reduction in diffraction efficiency was due to margin of error in the line width of the first chromium pattern, defective reproduction in etching, and the shape of the stepped portion becoming less clear-cut due to the sputtering.

Figure 17:
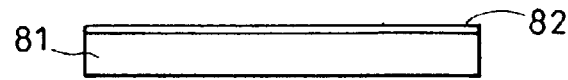
FIG. 17 is a cross-sectional diagram of a manufacturing process according to an eleventh embodiment.
Figure 17:
Figure 17:
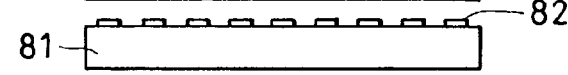
Figure 17:
Figure 17:
Figure 17:
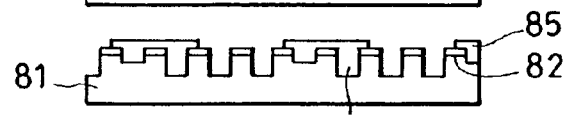
Figure 17:
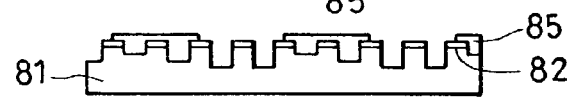
Figure 17:
Figure 17:
Figure 17:
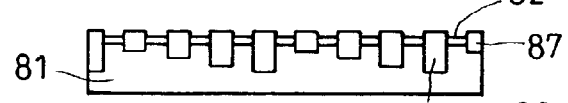
Figure 17:
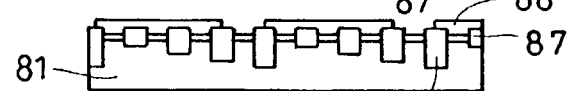
Figure 17:
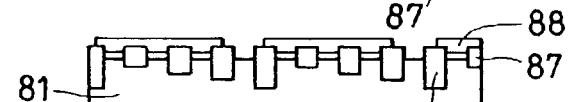
Figure 17:
Figure 18:
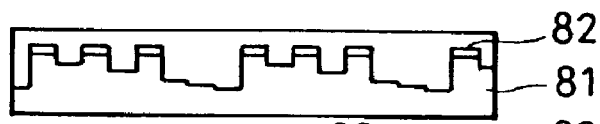
FIG. 18 is a cross-sectional diagram of a manufacturing process according to the eleventh embodiment.
Figure 18:
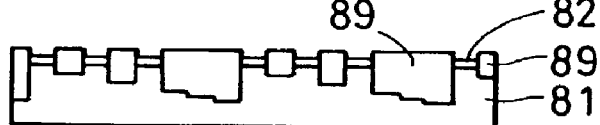
Figure 18:
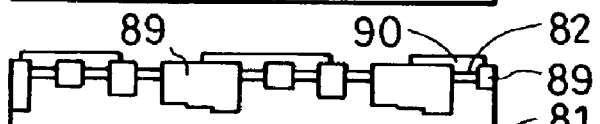
Figure 18:
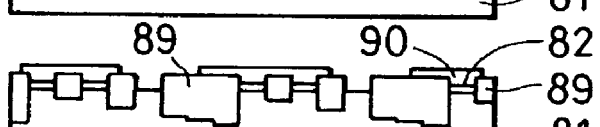
Figure 18:
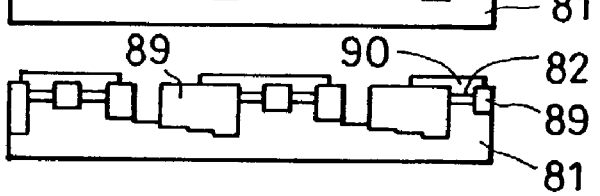
Figure 18:
Figure 18:
Figure 18:
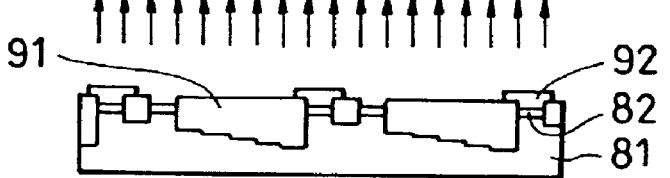
Figure 18:
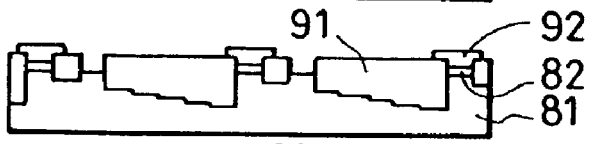
Figure 18:
Figure 18:
Figure 19:
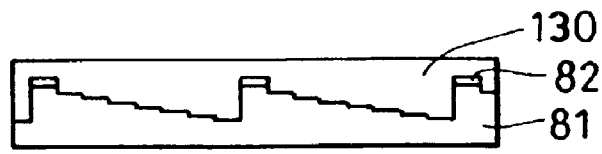
FIG. 19 is a cross-sectional diagram of a manufacturing process according to the eleventh embodiment.
Figure 19:
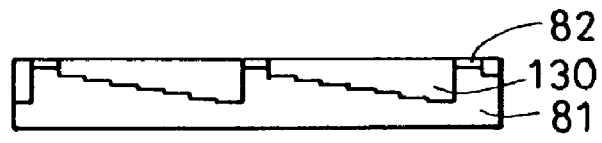
Figure 19:
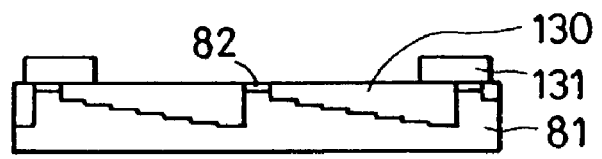
Figure 19:
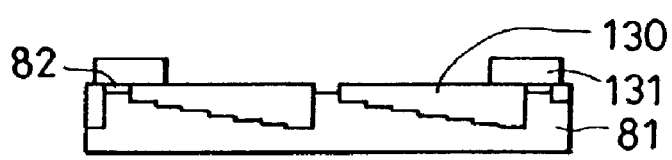
Figure 19:
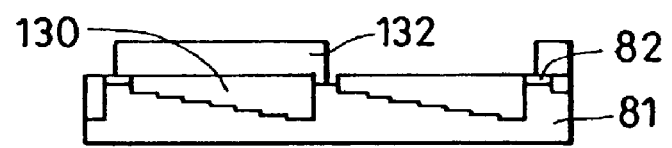
Figure 19:
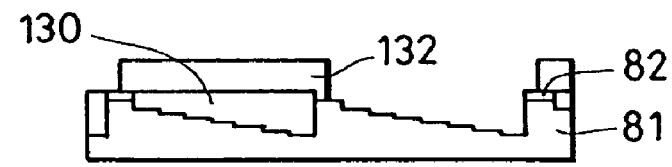
Figure 19:
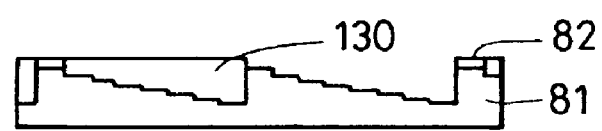
Figure 19:
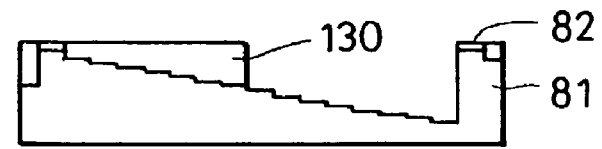
Figure 19:
Figure 19:

FIGS. 17 through 19 show cross-sectional diagrams of the manufacturing processed of the diffraction optical device according to the eleventh embodiment. The steps (1) through (24) in FIG. 17 and FIG. 18 are exactly the same as the steps (1) through (24) in FIG. 8 and FIG. 9 according to the first embodiment, except for the etching depth and etching time, so only the differing points shall be listed, and detailed description shall be omitted.

In step (3) of FIG. 17, with the pattern of the chromium film 82 as a mask, the quartz substrate 81 is etched by 30.5 μm for 2.5 minutes.

In step (13) of FIG. 17, with the resist patterns 87 and 88 as a mask, the quartz substrate 81 is etched by 183 μm for 15 minutes.

In step (18) of FIG. 18, with the resist patterns 89 and 90 as a mask, the quartz substrate 81 is etched by 122 μm for 10 minutes.

In step (24) of FIG. 18, with the resist patterns 91 and 92 as a mask, the quartz substrate 81 is etched by 61 pm for 5 minutes.

Using the technique wherein negative resist is exposed from the rear under the above conditions, a substrate 81 such as shown in step (24) in FIG. 18 is formed. Incidentally, the technique need not be rear exposure, but rather may be the DAMASCENE method using aluminum, the etch-back method, or the photo-CVD method using rear irradiation.

In step (25) of FIG. 19, an aluminum film 130 is formed to a thickness of 1.5 μm by means of the sputtering method. Then, polishing the aluminum film 123 according to the DAMASCENE method with a lapping machine under the conditions of 30 rpm and 50 g/cm$^3$, using a cerium oxide polishing agent of a 5/100 μm grain and a urethane sheet polishing cloth, until the surface of the chromium film 82 is exposed, yields the state such as shown in Step (26) of FIG. 19. Incidentally, the technique need not be the DAMASCENE method using aluminum, but rather may be rear exposure of negative resist, the etch-back method, or the photo-CVD method using rear irradiation. In Step (27) of FIG. 19, photo-resist is applied thereupon and exposed and developed, thereby forming the seventh resist pattern 131.

In Step (28) of FIG. 19, the portions of the chromium film 82 not covered with the resist pattern 131 and the aluminum film 130 are removed by etching with an etching fluid comprised of a mixture of cerium ammonium nitrate, perchloric acid, and water, for example. In Step (29) of FIG. 19, photo-resist is applied thereupon and exposed and developed, thereby forming the eighth resist pattern 132. Next, the aluminum film 130 not covered by the resist pattern 132 in this state is removed using a mixed fluid of phosphoric acid, nitric acid, acetic acid, and water, yielding the state shown in Step (30) of FIG. 19.

In Step (31) of FIG. 19, the photo-resist 132 is removed by means of the oxygen-plasma ashing method or with a peeling fluid. In Step (31) of FIG. 19, with the chromium film 82 and aluminum film 130 as a mask, a parallel plate-type RIE device, for example, using a mixed gas of $CF_4$ and hydrogen is used to etch the quartz substrate 81 by 244 nm in 20 minutes, under the conditions of: flow of $CF_4$ at 20 cm$^3$/min, flow of hydrogen at 3 cm$^3$/min, pressure at 4 Pa, and RF power of 60 W. Next, etching the aluminum film 130 with the same mixed fluid as that used in step (30) to remove it yields the state such as shown in Step (33) of FIG. 19. Next, the chromium film 82 is etched with a mixed fluid the same as that used in Step (30), thereby completing a diffraction optical device having a 16-stepped stair-like structure.

The diffraction optical device thus completed with a minimum line width of 0.35 μm and step offset of 30.5 nm was measured for diffraction efficiency at a usage wavelength of 248 nm, and the results showed that the diffraction efficiency minus loss owing to reflection was 97%, which is a 2% reduction in diffraction efficiency as compared to the ideal value. The main cause for this reduction in diffraction efficiency was due to margin of error in the line width of the first chromium pattern, and incorrect etching depth.

Figure 20:
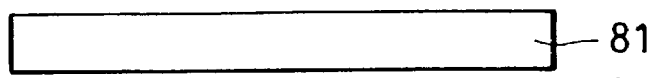
FIG. 20 is a cross-sectional diagram of a manufacturing process according to an twelfth embodiment.
Figure 20:
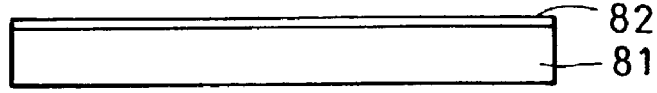
Figure 20:
Figure 20:
Figure 20:
Figure 20:
Figure 20:
Figure 20:
Figure 20:
Figure 20:
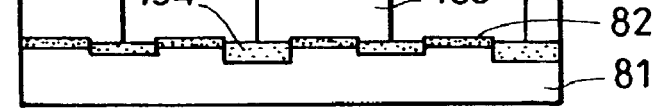
Figure 20:
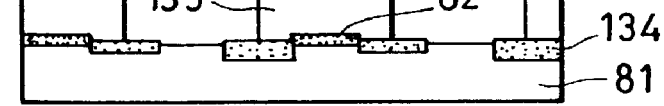
Figure 20:
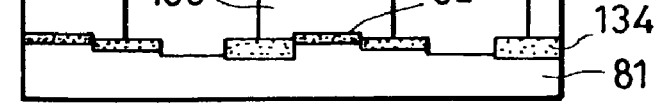
Figure 20:
Figure 20:
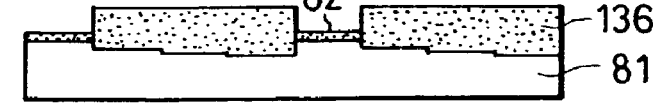
Figure 21:
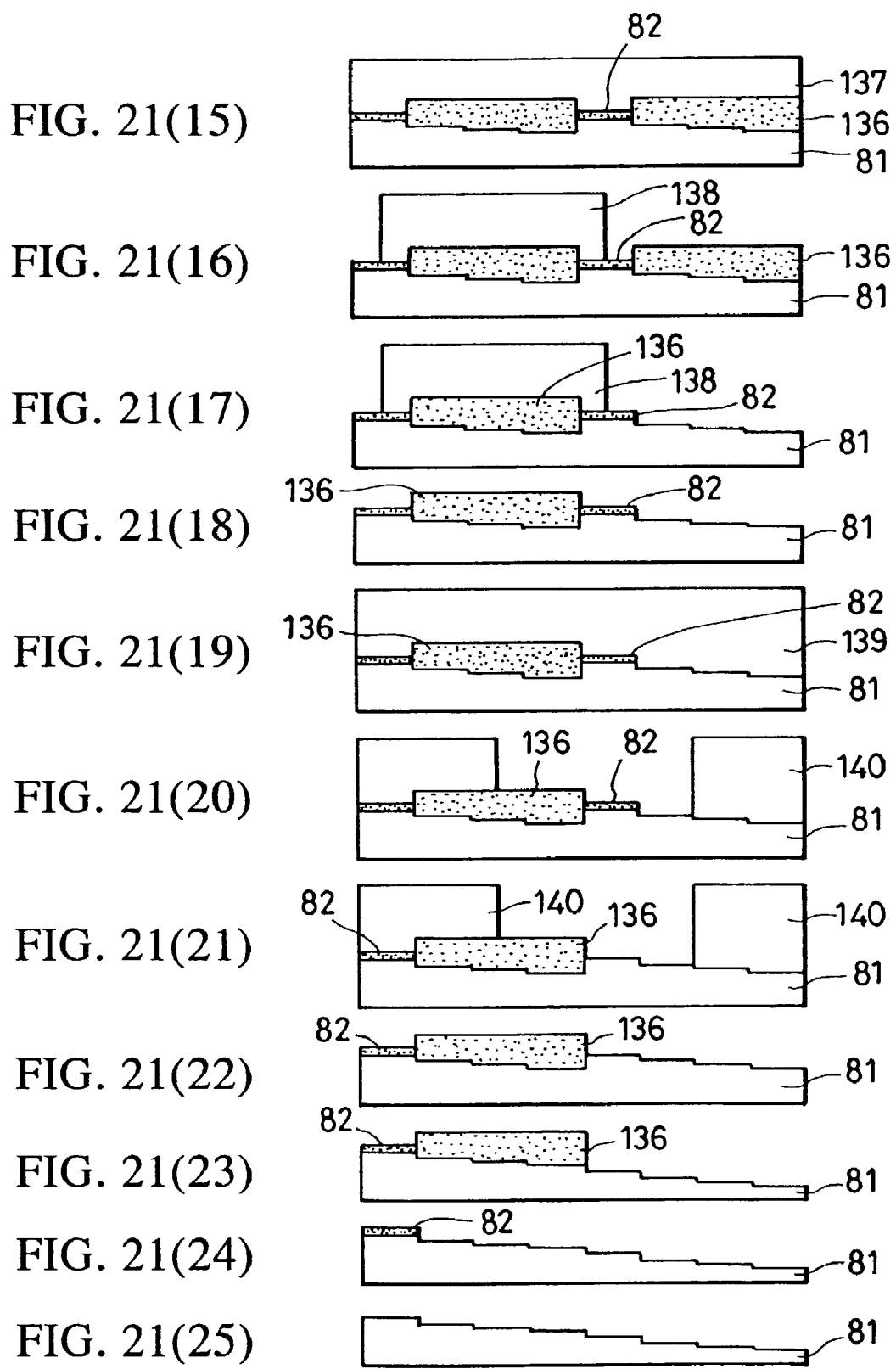
FIG. 21 is a cross-sectional diagram of a manufacturing process according to the twelfth embodiment.

FIG. 20 and FIG. 21 show cross-sectional diagrams of the process for manufacturing diffraction optical devices, according to the twelfth embodiment. In Step (1) of FIG. 20, a chromium film 102 is formed on a quartz substrate 81 to a thickness of 100 nm by the sputtering method, to form the state shown in step (2) of FIG. 20. Photo-resist is applied to this quartz substrate 81, and a first resist pattern is formed thereupon with both the line width and space width at 0.35 μm, by means of photo-lithography. Next, the chromium film 82 is etched with the resist pattern as a mask, by means of a parallel plate-type RIE device using chlorine gas or a mixed gas of chlorine gas and oxygen. Next, the photo-resist is peeled away, completing a chromium pattern such as shown in Step (3) of FIG. 20. The chromium pattern defines all of the step positions throughout all of the following steps.

In Step (4) of FIG. 20, with the pattern of the chromium film 82 as a mask, a parallel plate-type RIE device, for example, using a mixed gas of $CF_4$ and hydrogen is used to etch the quartz substrate 81 by 61 nm in five minutes, under the conditions of: flow of $CF_4$ at 20 cm$^3$/min, flow of hydrogen at 3 cm$^3$/min, pressure at 4 Pa, and RF power of 60 W. Next, in Step (5) of FIG. 20, photo-resist is applied to the substrate 81 and the second resist pattern 133 is formed. In Step (6) of FIG. 20, the quartz substrate 81 is etched by 122 nm using the resist pattern 133 and chromium film 82 pattern as a mask. Peeling of the resist 133 yields a state such as shown in Step (7) in FIG. 20.

In step (8) of FIG. 20, an aluminum film 134 is formed to a thickness of 1.5 μm by means of the sputtering method. Then, polishing the aluminum film 134 with a lapping machine under the conditions of 30 rpm and 50 g/cm$^3$, using a cerium oxide polishing agent of a 5/100 μm grain and a urethane sheet polishing cloth, until the surface of the chromium film 82 is exposed, yields the state such as shown in Step (9) of FIG. 20. In Step (10) of FIG. 20, photo-resist is applied thereupon and exposed and developed, thereby forming the fifth resist 135. In Step (11) of FIG. 20, the portions of the chromium 16 not covered with the resist pattern 135 and the aluminum film 134 are removed by etching with an etching fluid comprised of a mixture of cerium ammonium nitrate, perchloric acid, and water, for example.

Next, in Step (12) of FIG. 20, with the resist pattern 135 and aluminum film 134 as a mask, an RIE device the same as that used in Step (4) is used to etch the quartz substrate 81 by 122 nm in 10 minutes, under the same etching conditions. Next, the resist pattern 135 is removed by means of the ashing method or with a peeling fluid, and the aluminum film 134 is removed using a mixed fluid of phosphoric acid, nitric acid, acetic acid, and water, yielding the state shown in Step (13) of FIG. 20.

The substrate in the sate of step (13) in FIG. 20 is exposed to ultraviolet rays, e.g., a Kr F laser beam, from the rear side in an $Al_2(CH_3)_6$ gas. This allows forming of an aluminum oxide film 136 to a thickness of 500 nm, only at the portion where there is no chromium film 82, and at this time, there is also precipitation of an aluminum film 136 on the rear side, as well. In the event that the aluminum oxide film 136 on the rear side is unnecessary, this can be removed by applying a resist film thereupon, and removing with phosphoric acid as shown in Step (14) of FIG. 20. In Step (15) of FIG. 21, photo-resist is applied thereupon and exposed and developed, thereby forming the fifth resist 138.

In step (17) of FIG. 21, the portion of the aluminum oxide film 136 not covered with the resist pattern 138 is removed with phosphoric acid. In step (18) of FIG. 21, the resist pattern 138 is removed by means of the ashing method or with a peeling fluid, and photo-resist 139 is applied in step (19) of FIG. 21. Next, in step (20) of FIG. 21, a resist pattern 140 is formed by the photo-lithography method. In step (21) of FIG. 21, the portion of the chromium film 82 not covered with the resist pattern 140 is removed with the same mixed fluid as that used in step (11). Next, the resist pattern 140 is removed, yielding the state shown in step (22) of FIG. 21.

In Step (23) of FIG. 21, with the chrome film 82 and aluminum oxide film 136 as a mask, an RIE device the same as that used in Step (4) and a mixed gas of $CF_4$ and hydrogen are used to etch the quartz substrate 81 by 244 nm in 20 minutes, under the same etching conditions. In step (24) of FIG. 21, the portion of the aluminum oxide film 136 is removed by etching with phosphoric acid. Finally, the chromium film 82 is removed by etching using a mixed fluid the same as that used in step (11) for example, and an aluminum film 49 is formed on the stair-shaped substrate to a thickness of 100 nm, thus completing a reflection-type stepped diffraction optical device such as shown in step (25) of FIG. 21.

The diffraction optical device thus completed with a minimum line width of 0.35 µm and step offset of 61 nm was measured for diffraction efficiency at a usage wavelength of 248 nm, and the results showed that the diffraction efficiency minus loss owing to reflection was 91%, which is a 4% reduction in diffraction efficiency as compared to the ideal value. The main cause for this reduction in diffraction efficiency was due to margin of error in the line width of the first chromium pattern, and defective etching reproducibility. Incidentally, the diffraction efficiency of an example formed according to the known method was 76%, clearly demonstrating the advantages of the present invention.

Figure 22:
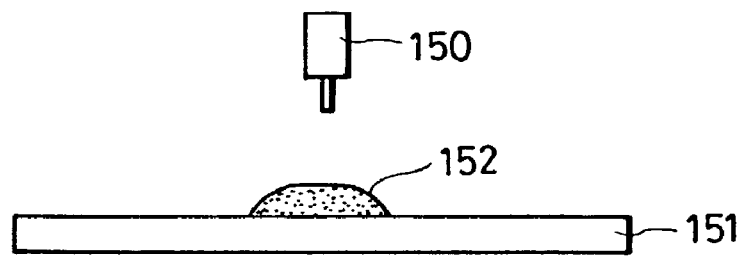
FIG. 22 is a cross-sectional diagram of a manufacturing process according to an thirteenth embodiment.
Figure 22:
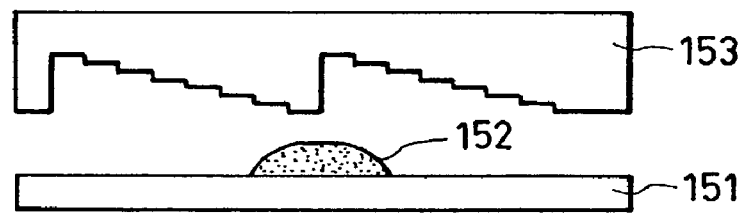
Figure 22:
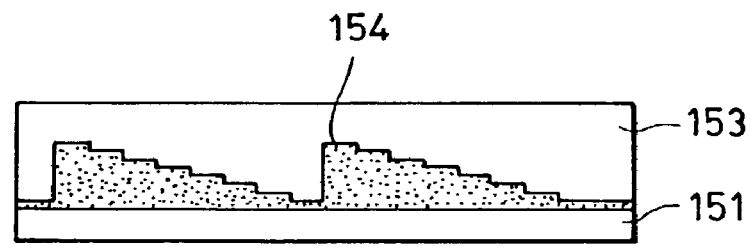
Figure 22:
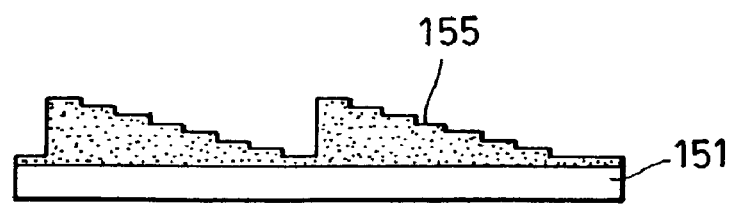

FIG. 22 shows a cross-sectional drawing of the manufacturing process of a stepped diffraction optical device formed of resin, according to a thirteenth embodiment. The stair-like substrate such as shown in FIG. 8 and FIG. 9 manufactured according to the sixth embodiment, the stair-like substrate such as shown in FIG. 10 and FIG. 11 manufactured according to the seventh embodiment, the stair-like substrate such as shown in FIG. 12 and FIG. 13 manufactured according to the eighth embodiment, or the stair-like substrate such as shown in FIG. 14 and FIG. 15 manufactured according to the ninth embodiment, is used as a mold.

First, in step (11) of FIG. 22, response-hardening resin 152, i.e., ultraviolet photo-setting resin or heat-setting resin such as acrylics or epoxies is dropped on the glass substrate 151 from a syringe 150. Next, as shown in step (2) of FIG. 22 and step (3) of FIG. 22, the stepped substrate mold 153 is pressed from above the resin 152, thus forming a replica layer 154. A separating agent is applied to the surface of the stair-shaped portion before pressing the stepped substrate mold 153 into the resin 152, as necessary.

Next, in the event that the resin is ultraviolet photo-setting resin, ultraviolet light is irradiated from the side of the stepped substrate mold 153, hardening the resin. In the event that the resin is heat-setting resin, heat is applied to harden the resin. Then, removing the stepped substrate mold 153 completes a stepped diffraction optical device 155 such as shown in step (4) of FIG. 22.

The diffraction optical device thus completed with a minimum line width of 0.35 µm and step offset of 120 nm was measured for diffraction efficiency at a usage wavelength of 500 nm, and the results showed that the diffraction efficiency was 90%, which is a 5% reduction in diffraction efficiency as compared to the ideal value. The main cause for this reduction in diffraction efficiency was due to margin of error in the line width of the first chromium pattern, defective etching reproducibility, and shrinkage and the like of the resin 147.

Figure 23:
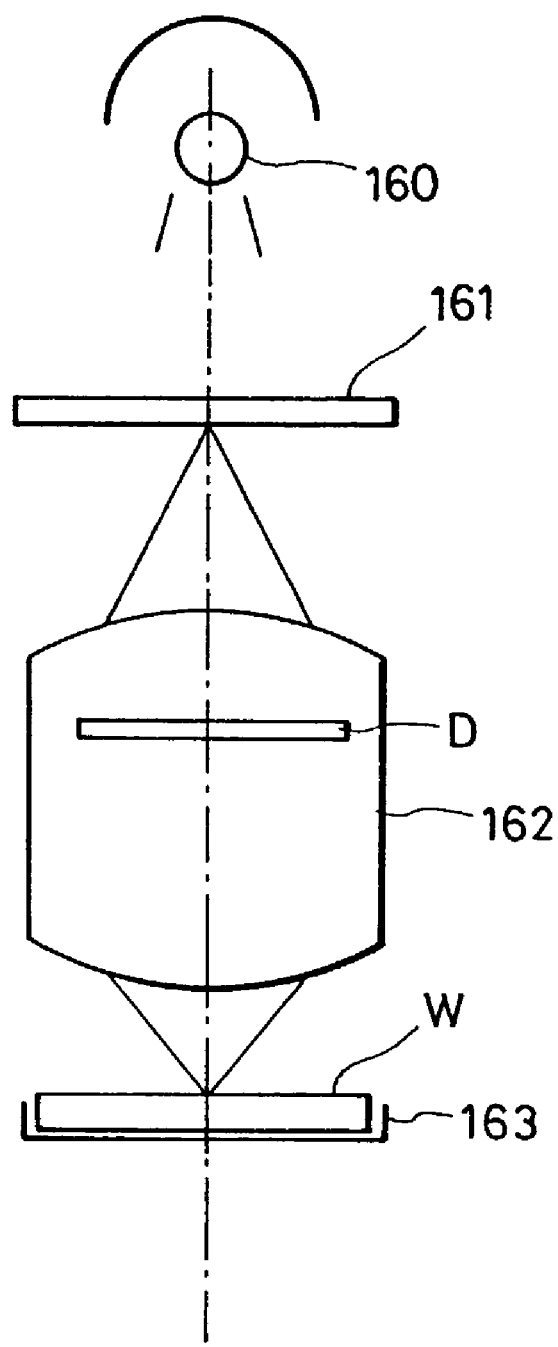
FIG. 23 is a configuration diagram of a stepper according to a fourteenth embodiment.

FIG. 23 shows a constructional diagram of a stepper which is a exposure device for semiconductor use, according to a fourteenth embodiment. Arrayed in order from above are a 248 nm wavelength illumination optical system 160, a reticle 161, imaging optical system 162, and a state 163 on which is mounted a semiconductor substrate W, with the diffraction optical device D manufactured according to the method of the first embodiment assembled therein, in order to reduce color aberration within the imaging optical system 162 and to provide non-spherical effects.

With this stepper, ultraviolet rays such as KrF or i rays are irradiated from the illumination optical system 160 to the reticle 161, and the pattern drawn on the reticle 161 is drawn on the semiconductor plate on the stage 163 at ⅕ reduction magnification, by means of the imaging optical system 162.

Figure 24:
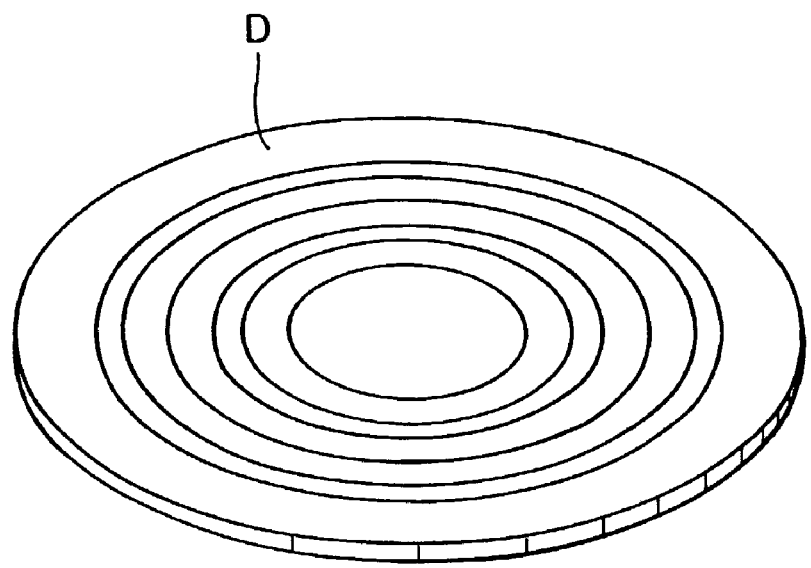
FIG. 24 is a perspective diagram of a stair-formed diffraction optical device.
Figure 25:
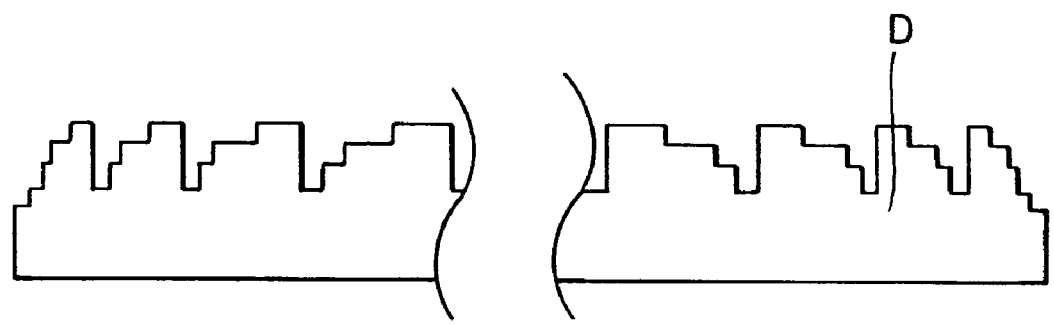
FIG. 25 is a cross-sectional diagram of a stair-formed diffraction optical device.
Figure 26:
FIG. 26 is a cross-sectional diagram of a manufacturing process according to a known example.
Figure 26:
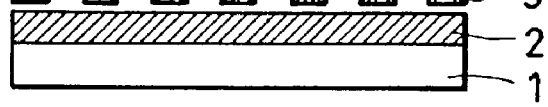
Figure 26:
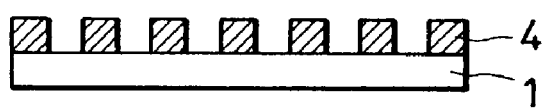
Figure 26:
Figure 26:
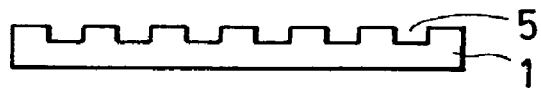
Figure 26:
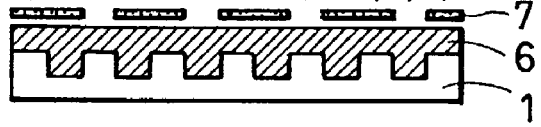
Figure 26:
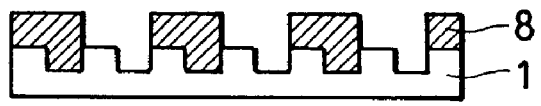
Figure 26:
Figure 26:
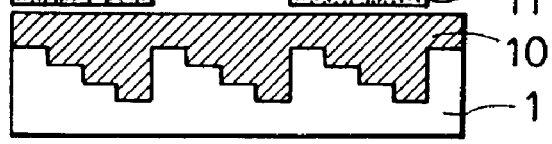
Figure 26:
Figure 26:

FIG. 24 is a perspective view of the diffraction optical device D, and FIG. 25 is a cross-sectional view of the cross-sectional state thereof. This diffraction optical device D has the same optical functions as a convex lens, representing a 4-step diffraction optical device with step offset of 61 nm, width of one step on the outermost perimeter of 0.35 µm, and 120 mm in diameter.

The light cast into the diffraction optical device D is mainly divided into first order, ninth order, and seventeenth order diffracted light and is transmitted through the device D. Of these, only the light of the first order has effects on the imaging, and consists of 93% of the incident light. The remaining several percent are the ninth order and seventeenth order light, but these are of diffraction orders far removed from the first order light necessary for imaging, so these head outwards from the imaging optical system, and do not affect the imaging much.

Figure 27:
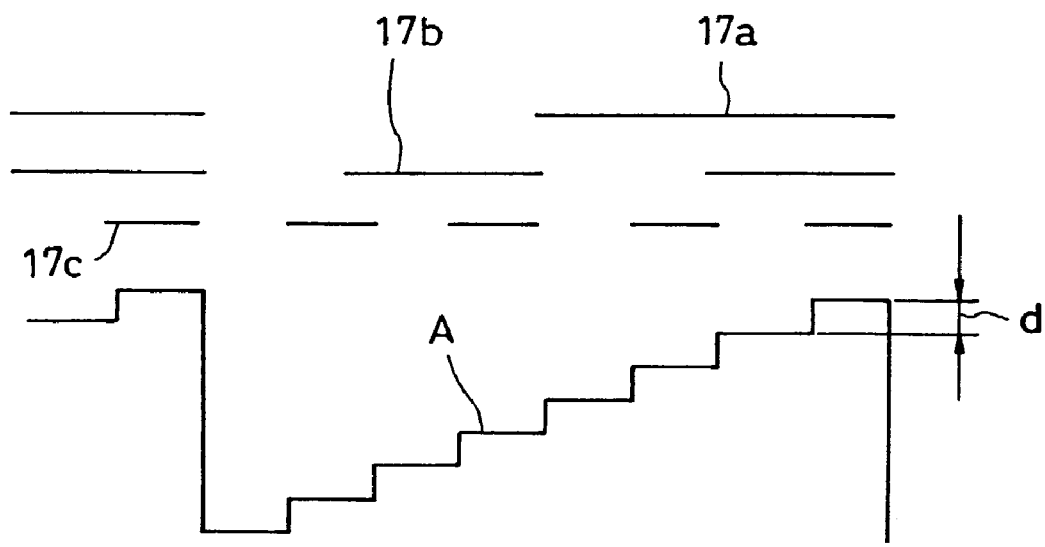
FIG. 27 is an explanatory diagram describing the relation between step form and mask.
Figure 28:
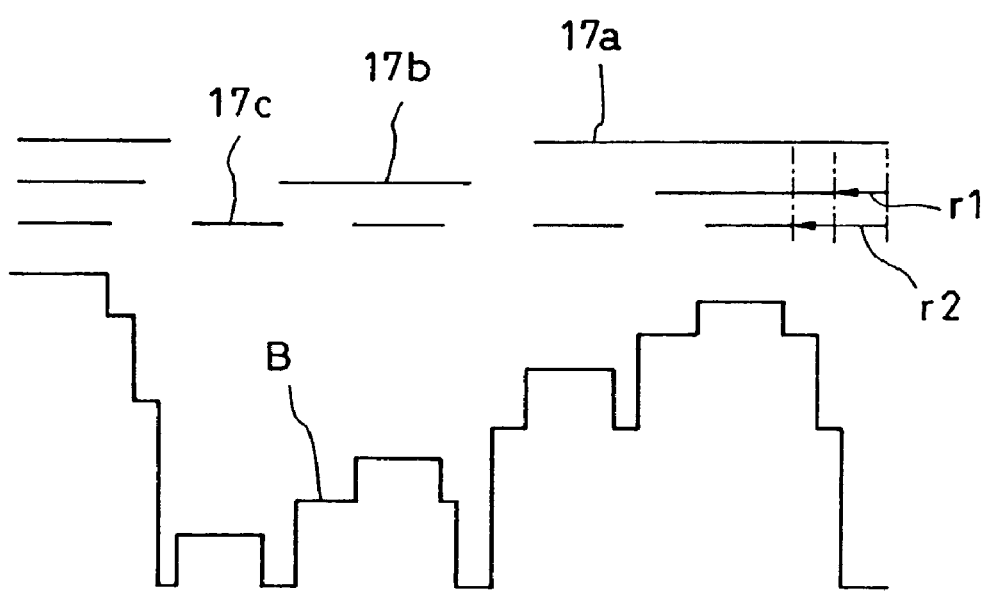
FIG. 28 is an explanatory diagram describing the relation between step form and mask.

Accordingly, in the event of using an 8-step diffraction optical device according to the known method wherein three masks 17a, 17b, and 17c are used in manufacturing under the same conditions (step offset of 61 nm, width of one step on the outermost perimeter of 0.35 µm, and 120 mm in diameter) as shown in FIG. 27, third order diffraction light is strongly generated between the first order and ninth order diffraction light, so the unwanted light forms pseudo-patterning on the image and the resolution deteriorates, but this problem can be avoided by means of using the 8-step diffraction optical device according to the present invention under the same conditions.

What is claimed is:

1. An optical equipment comprising an optical device having a stepped diffraction pattern formed on a substrate by a method comprising:
   a first step comprising forming a first masking pattern comprising a first masking material in a pattern of lines, spaces and recessed portions on said substrate, wherein the recessed portions are in the spaces of said first masking pattern;
   a second step of forming a second masking pattern comprising a second masking material in a pattern of lines and spaces on said substrate by filling the recessed portions formed on said substrate by said first step with said second masking material, wherein the spaces of said second masking pattern correspond to the lines of the first masking pattern;
   a third step comprising forming a third masking pattern by etching a portion of the lines of said first and second masking materials, and
   a fourth step comprising etching said substrate through said third masking pattern, said third masking pattern comprising non-etched portions of said first and second masking pattern.

2. The optical equipment according to claim 1, wherein in said second step, said second masking material is deposited using a forming method selected from the group consisting of an etch-back method, a lift-off method, a DAMASCENE method and a selective deposition method.

3. The optical equipment according to claim 1, wherein in said second step, said substrate is comprised of translucent material, said first masking material is a light-shielding material, and said second masking material is a deposited by means of a photo-assisted deposition method in which light is cast from the rear side of the substrate.

4. The optical equipment according to claim 1, wherein said first and second materials are selected from the group consisting of metals, oxides and nitrides.

5. A new projection optical system comprising an optical device having a stepped diffraction pattern formed on a substrate by a method comprising:
   a first step comprising forming a first masking pattern comprising a first masking material in a pattern of lines, spaces and recessed portions on said substrate, wherein the recessed portions are in the spaces of said first masking patter;
   a second step of forming a second masking pattern comprising a second masking material in a pattern of lines and spaces on said substrate by filling the recessed portions formed on said substrate by said first step with said second masking material, wherein the spaces of said masking pattern correspond to the lines of the first masking pattern;
   a third step comprising forming a third masking pattern by etching a portion of the lines of said first and second masking materials; and
   a fourth step comprising etching said substrate through said third masking pattern, said third masking pattern comprising non-etched portions of said first and second masking portion.

6. The projection optical system according to claim 5, wherein in said second step, said masking material is deposited using a forming method selected from the group consisting of a etch-back method, a lift-off method, a DAMASCENE method and a selective deposition method.

7. The projection optical system according to claim 5, wherein in said second step, said substrate is comprised of translucent material, said first masking material is a light-shielding material, and said second masking material is deposited by means of a photo-assisted deposition method in which light is cast from the rear side of the substrate.

8. The projection optical system according to claim 5, wherein said first and second materials are selected from the group consisting of metals, oxides and nitrides.

9. An exposure device comprising the projection optical system according to claim 5.

10. An illumination optical system comprising an optical device having a stepped diffraction pattern formed on a substrate produced by a method comprising:
    a first step comprising forming a first masking portion comprising a first masking material in a pattern of lines, spaces and recessed portions on said substrate, wherein the recessed portions are in the spaces of said first masking pattern;
    a second step of forming a second masking pattern comprising a second masking material in a pattern of lines and spaces on said substrate by filling the recessed portions formed on said substrate by said first step with said second masking material, wherein the spaces of said second masking pattern correspond to the lines of the first masking pattern;
    a third step comprising forming a third masking pattern by etching a portion of the lines of said first and second masking materials; and
    a fourth step comprising etching said substrate through said third masking pattern, said third masking pattern comprising non-etched portions of said first and second masking pattern.

11. The illumination optical system according to claim 10, wherein said second step, said second masking material is deposited using a forming method selected from the group consisting of a etch-back method, a lift-off method, a DAMASCENE method and a selective deposition method.

12. The illumination optical system according to claim 10, wherein said second step, said substrate is comprised of translucent material, said first masking material is a light-shielding material, and said second masking material is deposited by means of a photo-assisted deposition method in which light is cast from the rear side of the substrate.

13. The illumination optical system according to claim 10, wherein said first and second materials are selected from the group consisting of metals, oxides and nitrides.

14. An optical equipment comprising the illumination optical system according to claim 10.

15. An exposure device comprising the illumination optical system according to claim 10.

16. A diffraction optical device manufactured by applying a material to the mold according to claim 1 and separating the mold from the material.

17. An optical system comprising the diffraction optical device according to claim 16.

18. An optical equipment comprising an optical system according to claim 17.

19. A diffraction optical device manufactured by a method comprising the steps of:
    providing a base material that is partially covered with a first mask having diffraction pattern cycle portions;

etching portions of the base material not covered with said first mask;

then covering portions of said first mask other than the diffraction pattern cycle portions with a second mask;

repeating the above steps at least once;

then covering the portions of the base material not covered with said first mask with a third mask;

covering portions of said first mask other than the diffraction pattern cycle portions with said third mask and a fourth mask;

removing the portions of said first mask that are not masked with said third and fourth masks;

then etching said base material; and repeating the above steps at least once;

wherein a light-reflecting film is provided on the etched surface in the final step of said method.

20. An optical system comprising the diffraction optical device according to claim 19.

21. An optical equipment comprising an optical system according to claim 20.

22. A diffraction optical device produced by the method comprising applying a material to the mold according to claim 19 and separating the mold from the material.

23. An optical system comprising the diffraction optical device according to claim 22.

24. An optical equipment comprising the optical system according to claim 23.

25. A diffraction optical device produced by the method comprising the steps of:

providing a base material that is partially covered with a first mask having diffraction pattern cycle portions;

etching portions of the base material not covered with said first mask;

then covering portions of said first mask other than the diffraction pattern cycle portions with a second mask;

etching portions of the base material not covered with a mask;

repeating the above steps at least once;

then covering the portions of the base material not covered with said first mask with a third mask;

covering portions of said first mask other than the diffraction pattern cycle portions with said third mask and a fourth mask;

removing the portions of said first mask that are not masked;

then repeating at least one step of etching said base material;

removing said third mask and fourth mask;

covering the portions of the base material not covered with said first mask with a fifth mask;

then covering every other portion of said first mask with a sixth mask;

removing the portions of said first mask that are not covered by said fifth and sixth mask;

then covering every other portion of said fifth mask with a seventh mask;

removing the portions of said fifth mask that are not covered by said seventh mask;

etching said base material of the portions not covered by said fifth mask and said first mask;

and finally removing the remaining said fifth mask and said first mask;

wherein a light-reflecting film is provided on the etched surface in the final step.

26. An optical system comprising the diffraction optical device according to claim 25.

27. An optical equipment comprising the optical system according to claim 26.

28. An optical system comprising a diffraction grading having a stepped diffraction pattern on a substrate produced by the method comprising the steps of:

forming a first mask on an area of said substrate corresponding with every other step, and performing at least one of etching and deposition on an area of said substrate on which said first mask in not formed; and forming a second mask on an area of said substrate on which said first mask has not been formed, and performing at least one of etching and deposition on the area of said substrate on which neither of said first and said second masks is formed, wherein said first mask is formed of a metal.

29. The optical system according to claim 28, wherein said plurality of steps have differing dimensions.

30. A projecting exposing device comprising the optical system according to claim 29.

31. The device according to claim 30, wherein said optical system is a projection optical system.

32. A method for transferring device pattern onto a wafer comprising treating the wafer with a device according to claim 31.

33. A method for transferring a device pattern onto a wafer comprising treating the wafer with a device according to claim 29.

34. The optical system according to claim 28, wherein said said optical system is a projection optical system.

* * * * *

UNITED STATES PATENT AND TRADEMARK OFFICE
CERTIFICATE OF CORRECTION

| | |
|---|---|
| PATENT NO. | : 7,018,783 B2 |
| APPLICATION NO. | : 10/227794 |
| DATED | : March 28, 2006 |
| INVENTOR(S) | : Yuichi Iwasaki et al. |

It is certified that error appears in the above-identified patent and that said Letters Patent is hereby corrected as shown below:

ON COVER PAGE AT (30) FOREIGN APPLICATION PRIORITY DATA

"9/268087" should read --9-268087--.

COLUMN 2

Line 61, "reticule 17a" should read --reticle 17a--; and "reticule 17c" should read --reticle 17c--.

COLUMN 3

Line 3, "of" (second occurrence) should read --being--; and
Line 11, "is" (second occurrence) should be deleted.

COLUMN 5

Line 54, "case" should read --cast--; and
Line 63, "the and" should be deleted.

COLUMN 11

Line 33, "with-the" should read --with the--.

COLUMN 15

Line 19, "processed" should read --processes--; and
Line 37, "61 pm" should read --61 μm--.

COLUMN 19

Line 26, "materials," should read --materials;--;
Line 39, "a" should be deleted;
Line 45, "new" should be deleted;
Line 52, "patter;" should read --pattern;--;
Line 58, "masking" should read --second masking--; and
Line 67, "portion." should read --pattern.--.

UNITED STATES PATENT AND TRADEMARK OFFICE
CERTIFICATE OF CORRECTION

| | |
|---|---|
| PATENT NO. | : 7,018,783 B2 |
| APPLICATION NO. | : 10/227794 |
| DATED | : March 28, 2006 |
| INVENTOR(S) | : Yuichi Iwasaki et al. |

It is certified that error appears in the above-identified patent and that said Letters Patent is hereby corrected as shown below:

COLUMN 20

Line 2, "masking" should read --second masking--;
Line 4, "a" (first occurrence) should read --an--;
Line 20, "portion" should read --pattern--;
Line 40, "wherein" should read --wherein in--;
Line 42, "a" (first occurrence) should read --an--;
Line 45, "wherein" should read --wherein in--; and
Line 58, "according to claim 1" should read --comprising the steps of: providing a base material that is partially covered with a first mask having diffraction pattern cycle portions; etching portions of the base material not covered with said first mask; then covering portions of said first mask other than the diffraction pattern cycle portions with a second mask; repeating the above steps at least once; then covering the portions of the base material not covered with said first mask with a third mask; covering portions of said first mask other than the diffraction pattern cycle portions with said third mask and a fourth mask; removing the portions of said first mask that are not masked with said third and fourth masks; then etching said base material; and repeating the above steps at least once;--.

UNITED STATES PATENT AND TRADEMARK OFFICE
CERTIFICATE OF CORRECTION

PATENT NO. : 7,018,783 B2
APPLICATION NO. : 10/227794
DATED : March 28, 2006
INVENTOR(S) : Yuichi Iwasaki et al.

It is certified that error appears in the above-identified patent and that said Letters Patent is hereby corrected as shown below:

COLUMN 21

Line 14, "once;" should read --once,--;
Line 22, "according to" should be deleted;
Line 23, "claim 19" should read --comprising the steps of: providing a base material that is partially covered with a first mask having diffraction pattern cycle portions; etching portions of the base material not covered with said first mask; then covering portions of said first mask other than the diffraction pattern cycle portions with a second mask; etching portions of the base material not covered with a mask; repeating the above steps at least once; then covering the portions of the base material not covered with said first mask with a third mask; covering portions of said first mask other than the diffraction pattern cycle portions with said third mask and a fourth mask; removing the portions of said first mask that are not masked; then repeating at least once a step of etching said base material; removing said third mask and fourth masks; covering the portions of the base material not covered with said first mask with a fifth mask; then covering every other portion of said first mask with a sixth mask; removing the portions of said first mask that are not covered by said fifth and sixth masks; then covering every other portion of said fifth mask with a seventh mask; removing the portions of said fifth mask that are not covered by sais seventh mask; etching said base material at the portions not covered by said fifth mask and said first mask; and finally removing the remaining said fifth mask and said first mask--; and
Line 46, "one" should read --once a--.

UNITED STATES PATENT AND TRADEMARK OFFICE
CERTIFICATE OF CORRECTION

PATENT NO. : 7,018,783 B2
APPLICATION NO. : 10/227794
DATED : March 28, 2006
INVENTOR(S) : Yuichi Iwasaki et al.

It is certified that error appears in the above-identified patent and that said Letters Patent is hereby corrected as shown below:

COLUMN 22

Line 9, "of" should read --at--;
Line 12, "mask;" should read --mask,--;
Line 20, "grading" should read --grating--;
Line 45, "claim 29" should read --claim 30--; and
Line 47, "said" (second occurrence) should be deleted.

Signed and Sealed this

Seventeenth Day of October, 2006

JON W. DUDAS
*Director of the United States Patent and Trademark Office*